United States Patent
Suzuki et al.

(10) Patent No.: US 8,219,744 B2
(45) Date of Patent: Jul. 10, 2012

(54) SEMICONDUCTOR MEMORY DEVICE WHICH INCLUDES MEMORY CELL HAVING CHARGE ACCUMULATION LAYER AND CONTROL GATE

(75) Inventors: Takahiro Suzuki, Chigasaki (JP);
Shinya Fujisawa, Hachioji (JP);
Tokumasa Hara, Kawasaki (JP);
Masuji Nishiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/301,969

(22) Filed: Nov. 22, 2011

(65) Prior Publication Data
US 2012/0063229 A1 Mar. 15, 2012

Related U.S. Application Data

(62) Division of application No. 12/018,493, filed on Jan. 23, 2008, now Pat. No. 8,082,383.

(30) Foreign Application Priority Data

Jan. 24, 2007 (JP) ................................ 2007-014057

(51) Int. Cl.
*G06F 12/02* (2006.01)

(52) U.S. Cl. ........ 711/103; 711/154; 711/156; 713/300; 714/48

(58) Field of Classification Search .................. 711/103, 711/154, 156; 713/300; 714/48
See application file for complete search history.

(56) References Cited

U.S. PATENT DOCUMENTS

| 5,122,688 | A | * | 6/1992 | Grimes ........................... 326/59 |
| 5,602,789 | A | * | 2/1997 | Endoh et al. ............. 365/185.03 |
| 6,260,103 | B1 | * | 7/2001 | Alexis et al. .................. 711/103 |
| 6,424,571 | B1 | * | 7/2002 | Pekny ....................... 365/185.21 |
| 6,542,411 | B2 | | 4/2003 | Tanikawa et al. |
| 7,010,576 | B2 | | 3/2006 | Bae |

(Continued)

FOREIGN PATENT DOCUMENTS

JP 7-29386 1/1995
(Continued)

OTHER PUBLICATIONS

Japanese Office Action mailed Mar. 12, 2012, in Japanese Patent Application No. 2007-014057 filed Jan. 24, 2007 (with English Translation).

*Primary Examiner* — Jae Yu
(74) *Attorney, Agent, or Firm* — Oblon, Spivak, McClelland, Maier & Neustadt, L.L.P.

(57) ABSTRACT

A semiconductor memory device includes a memory cell array, a power source circuit, a sense amplifier, a control circuit, and a processor. The memory cell array includes a nonvolatile memory cell. The power source circuit includes a first register and generates a voltage. The sense amplifier includes a second register, reads from the memory cell and amplifies the read data. The control circuit includes a third register and controls operations of the power source circuit and the sense amplifier. The processor controls the operations of the power source circuit, the sense amplifier and the control circuit by giving an instruction to the first to third registers. The control circuit decodes the instruction received at the third register so as to control the power source circuit and the sense amplifier directly based on a result of decoding.

4 Claims, 16 Drawing Sheets

U.S. PATENT DOCUMENTS

| | | |
|---|---|---|
| 7,161,852 B2 | 1/2007 | Kwachk et al. |
| 2003/0007383 A1* | 1/2003 | Pekny ...................... 365/185.02 |
| 2003/0145154 A1* | 7/2003 | Barnett et al. ................ 711/103 |
| 2003/0181051 A1 | 9/2003 | Chang et al. |
| 2004/0044874 A1 | 3/2004 | Leach et al. |

FOREIGN PATENT DOCUMENTS

| | | |
|---|---|---|
| JP | 11-175501 | 7/1999 |
| JP | 2000-173283 | 6/2000 |
| JP | 2002-269065 | 9/2002 |
| JP | 2006-351192 | 12/2006 |

* cited by examiner

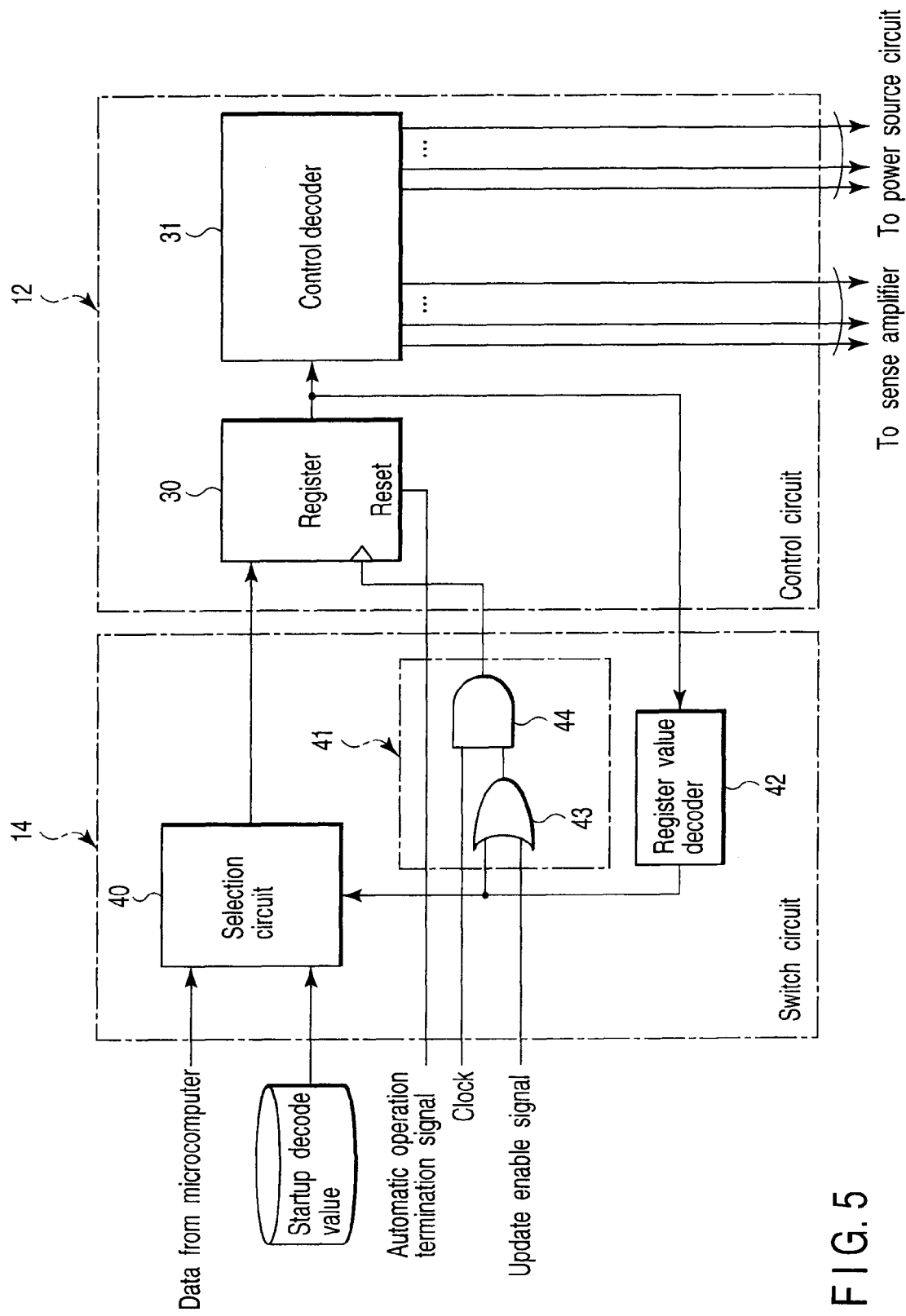
F I G. 5

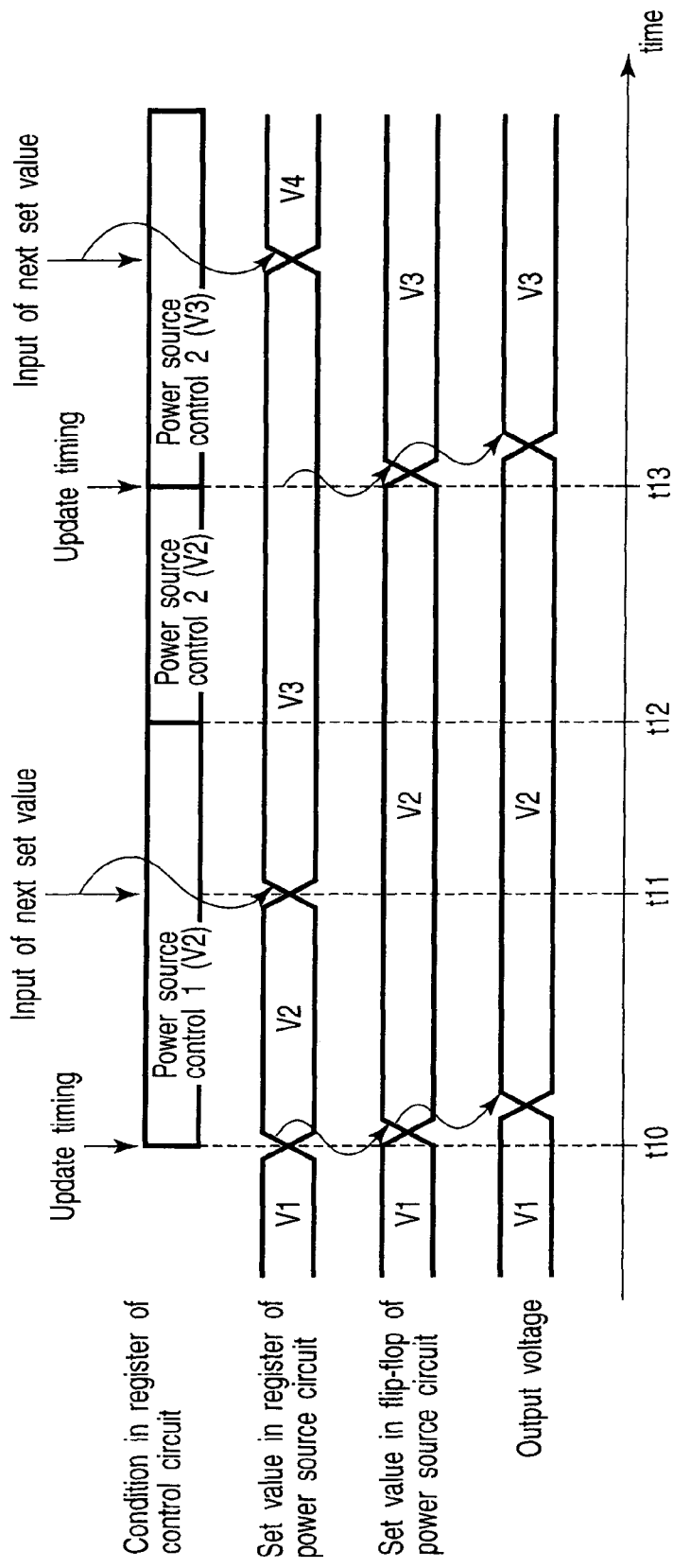
F I G. 10

At time of verification of regular block

At time of verification of boot block

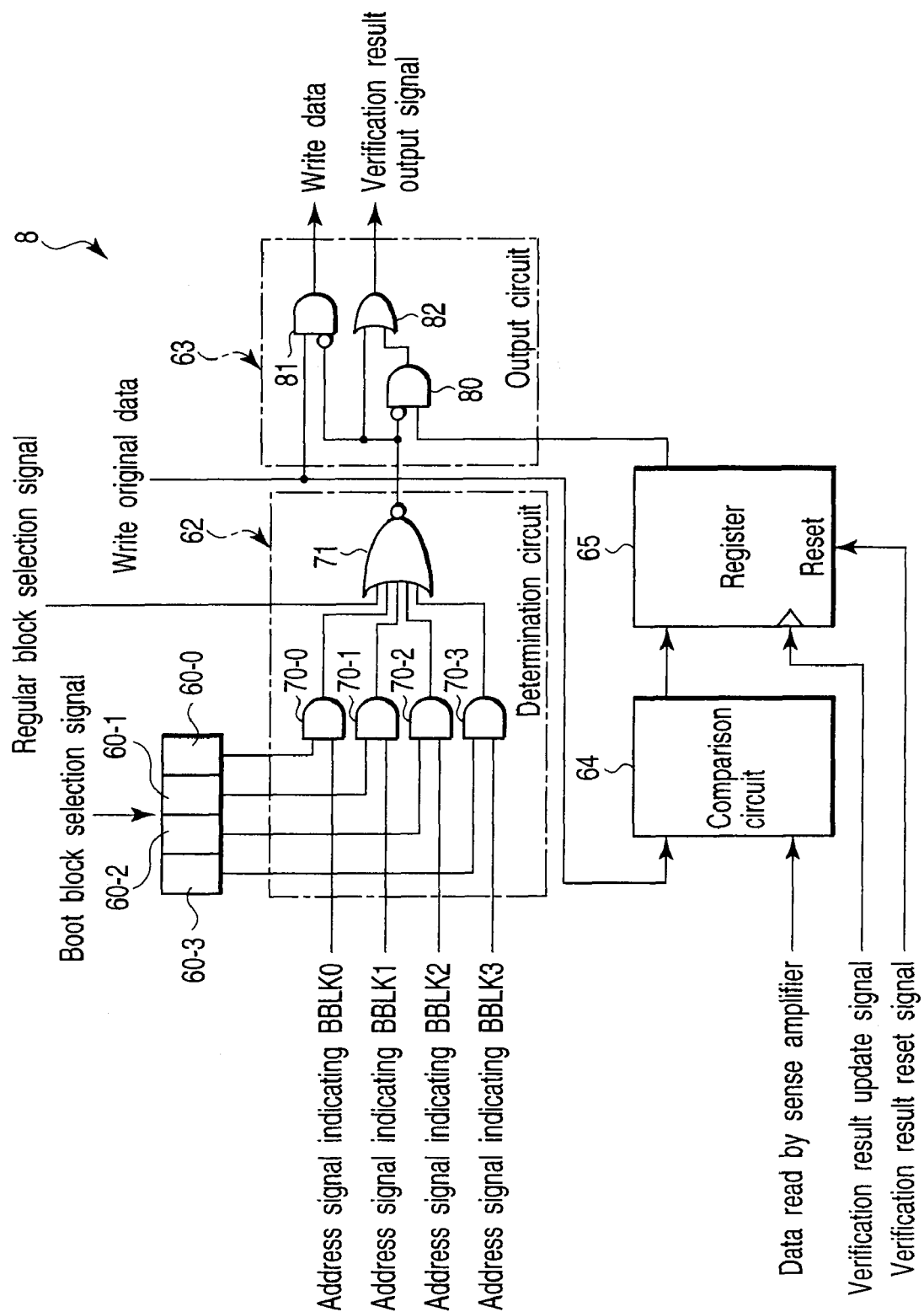
F I G. 13

SEMICONDUCTOR MEMORY DEVICE WHICH INCLUDES MEMORY CELL HAVING CHARGE ACCUMULATION LAYER AND CONTROL GATE

CROSS-REFERENCE TO RELATED APPLICATIONS

This application is a divisional of U.S. application Ser. No. 12/018,493 filed Jan. 23, 2008, and is based upon and claims the benefit of priority from prior Japanese Patent Application No. 2007-014057, filed Jan. 24, 2007, the entire contents of each of which are incorporated herein by reference.

BACKGROUND OF THE INVENTION

1. Field of the Invention

The present invention relates to a semiconductor memory device. More particularly, the invention relates to a semiconductor memory which includes a memory cell having a charge accumulating layer and a control gate.

2. Description of the Related Art

Conventionally, an electrically erasable and programmable ROM (EEPROM) has been well known as a nonvolatile semiconductor memory which is rewritable electrically. A method for controlling the EEPROM using a microcomputer has been disclosed in, for example, Jpn. Pat. Appln. KOKAI Publication No. 2002-269065.

In case of controlling the EEPROM by a microcomputer, a flash memory circuit is controlled using a signal with small bits which is supplied from a processor and which is transmitted by address line, data line and write control line. Therefore, this has an advantage that the quantity of the signal wires can be reduced. Further, change and correction of the content of automatic control by the microcomputer are carried out by changing and correcting software for operating the processor. Thus, there is such a merit that correction of a circuit itself is not required, thereby suppressing cost of manufacturing process.

However, as demerits of EEPROM control by a microcomputer, a time-lag is generated from an input of automatic operation start command up to startup of the microcomputer and the quantity of signal wires which can be controlled at a time is limited, thereby retarding the processing.

BRIEF SUMMARY OF THE INVENTION

A semiconductor memory device according to an aspect of the present invention includes:

a memory cell array which includes a nonvolatile memory cell;

a power source circuit which includes a first register and generates a voltage to be used in at least any one of write, erase and read of data with respect to the memory cell;

a sense amplifier which includes a second register, reads data from the memory cell and amplifies the read data;

a control circuit which includes a third register and controls operations of the power source circuit and the sense amplifier; and a processor which controls the operations of the power source circuit, the sense amplifier and the control circuit by giving an instruction to the first to third registers, the control circuit decoding the instruction of the processor received at the third register so as to control the power source circuit and the sense amplifier directly based on a result of decoding.

BRIEF DESCRIPTION OF THE SEVERAL VIEWS OF THE DRAWING

FIG. 5 is a circuit diagram of a switch circuit and a control circuit according to the second embodiment of the present invention;

FIG. 10 is a timing chart of various kinds of signals when the flash memory is operated according to the third embodiment of the present invention;

FIG. 13 is a circuit diagram of a verification circuit according to the fourth embodiment of the present invention;

DETAILED DESCRIPTION OF THE INVENTION

First Embodiment

Figure 1:
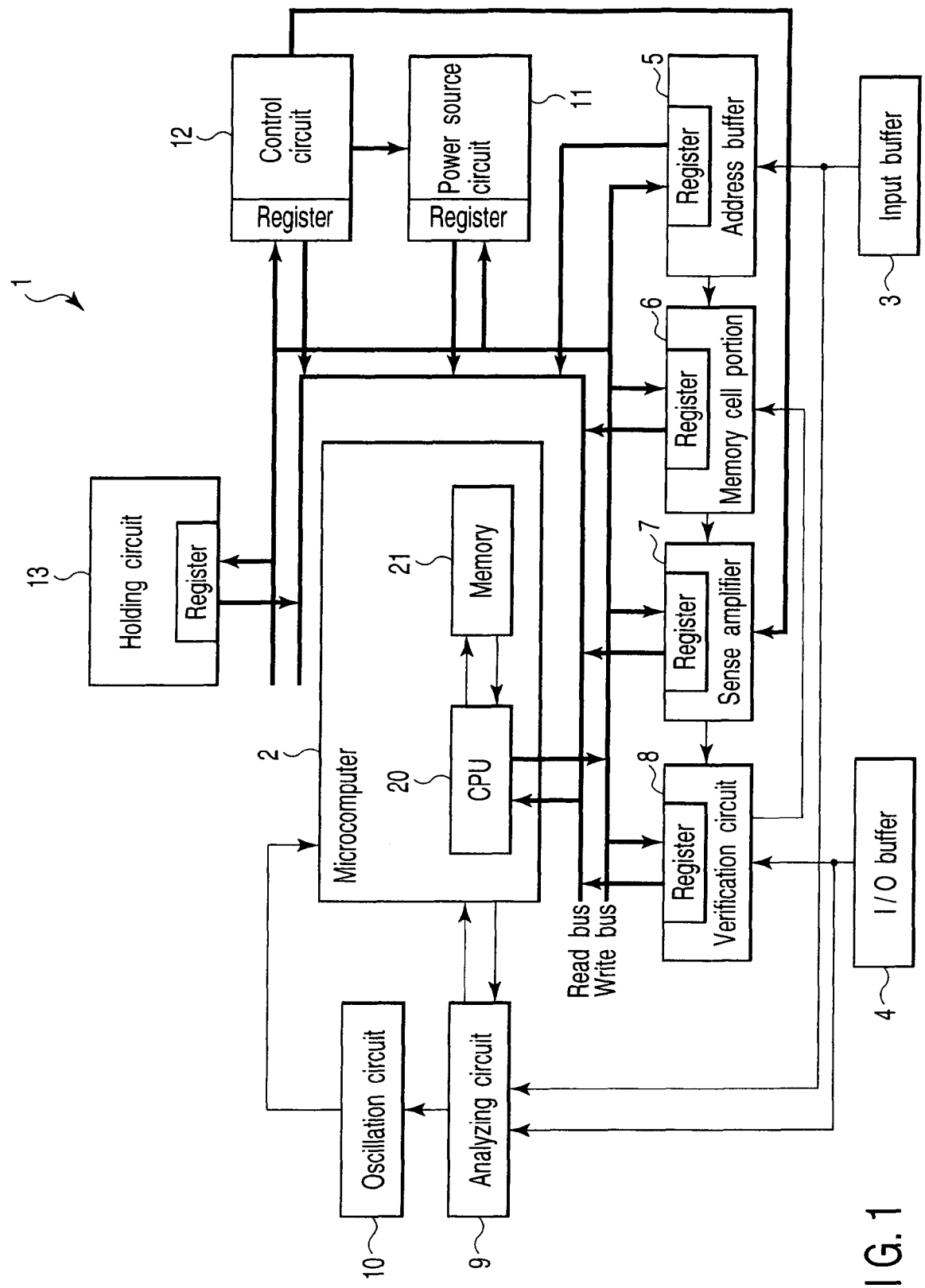
FIG. 1 is a block diagram of a flash memory according to a first embodiment of the present invention.

A semiconductor memory device according to a first embodiment of the present invention will be described. FIG. 1 is a block diagram of a NOR type flash memory according to this embodiment. The NOR type flash memory of this embodiment has two operation modes, i.e., first operation mode and second operation mode. The first operation mode is an operation mode which automatically executes read, write and erase of data synchronously with a clock under the control of the CPU and hereinafter, is sometimes called automatic operation mode. The second operation mode is an operation mode which is executed independently of the control of the CPU and hereinafter, is sometimes called non-automatic operation mode.

As shown in FIG. 1, a NOR type flash memory 1 includes a microcomputer 2, an input buffer 3, an I/O buffer 4, an address buffer 5, a memory cell portion 6, a sense amplifier 7, a verification circuit 8, an analyzing circuit 9, an oscillation circuit 10, a power source circuit 11, a control circuit 12 and a holding circuit 13. Each of the above-mentioned circuit blocks 5-8, 11-13 has a register for receiving an instruction from the microcomputer. Upon transmission of signals between the microcomputer 2 and each of the circuit blocks 5-8, 11-13, a read bus and a write bus are used for read of data and write of data, respectively.

The microcomputer 2 includes a CPU 20 and a memory 21. The memory 21 holds instructions to be executed by the CPU 20. The CPU 20 executes an instruction held in the memory 21 under the automatic operation mode so as to control the operations of the circuit blocks 5-8, 11-13. When the CPU 20 outputs an instruction to the circuit blocks 5-8, 11-13 under the automatic operation mode, the circuit blocks 5-8, 11-13 receive the instructions through a register. The respective circuit blocks 5-8, 11-13 decode the received instruction and executes the given instruction.

The input buffer 3 receives an address given from outside. Then, the received address is output to the address buffer 5 and the analyzing circuit 9.

The I/O buffer 4 receives write data and command given from outside. The received write data is output to the verification circuit 8 and the command is output to the analyzing circuit 9. Read data given from the verification circuit 8 is output to outside.

The address buffer 5 holds an address given from the I/O buffer 3 and outputs the address to the memory cell portion 6 and the analyzing circuit 9.

Figure 2:
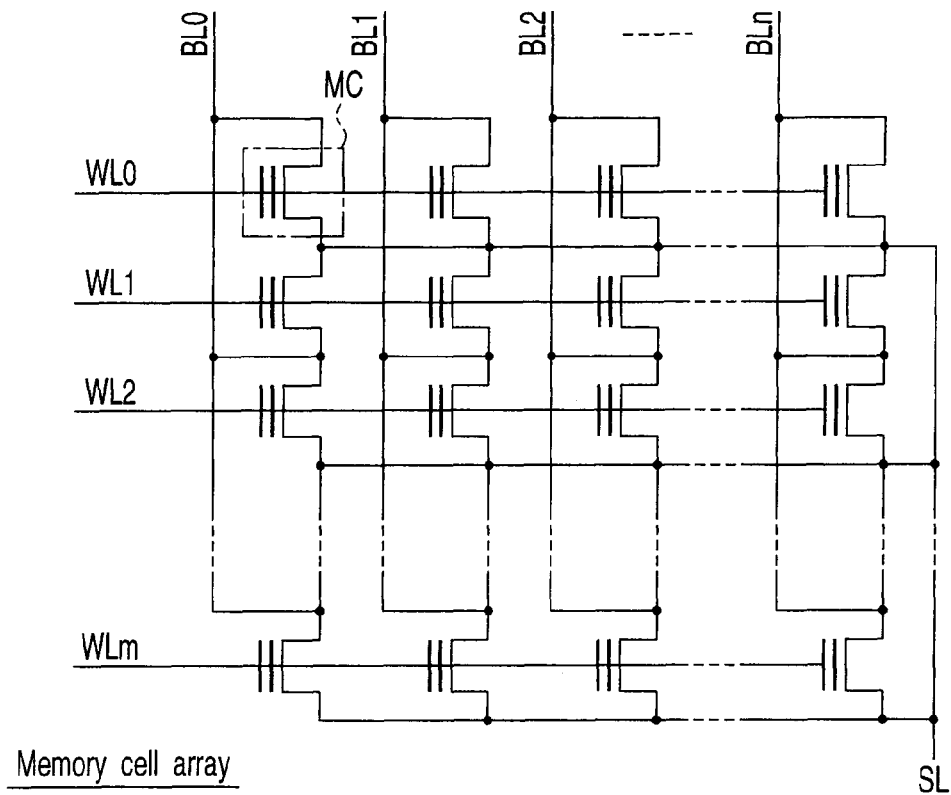
FIG. 2 is a circuit diagram of a memory cell array according to the first embodiment of the present invention.

The memory cell portion 6 includes a nonvolatile memory cell, which memorizes data given from outside. The memory cell portion 6 includes a memory cell array in which memory cells are arranged in matrix configuration, a row decoder which selects the row direction of the memory cell array and a column decoder which selects the column direction. An address given from the address buffer is input to the row decoder and column decoder. FIG. 2 is a circuit diagram of the memory cell array having the memory cell portion 6.

As shown in FIG. 2, the memory cell array includes ((m+1)×(n+1)) (m, n are natural numbers) memory cells MC. The memory cell MC is a MOS transistor having a stacked gate which includes a charge accumulation layer (for example, a floating gate in the present embodiment) and a control gate.

The configuration of the stacked gate is as follows. That is, the charge accumulation layer is formed on the semiconductor substrate with a gate insulating film interposed therebetween and the control gate is formed on the charge accumulation layer with an inter-gate insulating film interposed therebetween. The accumulation layer and control gate are formed of polycrystalline silicon layer. The gate insulating film is formed of a silicon oxide film. The inter-gate insulating film is formed of a silicon oxide film or an ON film, NO film or ONO film having a laminated structure of a silicon oxide film and silicon nitride film. The control gates of the memory cells MC which are arranged on the same row are commonly connected to a corresponding one of word lines WL0 to WLm. Further, the drains of the memory cells MC which are arranged on the same column are commonly connected to a corresponding one of bit lines BL0 to BLn. In addition, the sources of the memory cells MC are commonly connected to the same source line SL. For convenience sake in the following explanation, the word lines WL0 to WLm may be referred to as word lines WL and the bit lines BL0 to BLn may be referred to as bit lines BL in some cases.

The row decoder (not shown) selects any one of the word lines WL and the column decoder selects any one of the bit lines BL.

Returning to FIG. 1, when data is read, the sense amplifier 7 reads data from the memory cell MC connected to the word line WL selected by the row decoder and the bit line BL selected by the column decoder and amplifies the data.

The verification circuit 8 writes write data given from the I/O buffer 4 to the memory cell MC. The verification circuit 8 outputs data read by the sense amplifier 7 to outside through the I/O buffer 4. Further, the verification circuit 8 executes a verification operation using data read by the sense amplifier 7 and write data. The verification operation is an operation for verifying whether or not data write or erase has been carried out properly.

The analyzing circuit 9 analyzes a command given from the I/O buffer 4 using an address given from the input buffer 3. A result of command analysis is output to the microcomputer 2 and the oscillation circuit 10.

The oscillation circuit 10 generates a clock based on the result of command analysis and supplies the clock to the microcomputer 2. The CPU 20 of the microcomputer 2 is operated synchronously with the clock.

The power source circuit 11 is provided with a charge pump circuit for raising a voltage given from outside. A voltage necessary for write, read and erase of the data in the memory cell is generated under the control of the microcomputer 2 and the control circuit 12.

The holding circuit 13 holds protect information. The protect information is the following information. The memory cell array includes a memory cell MC whose data is prohibited to be updated or erased. The information indicating which memory cell MC data is prohibited to be updated or erased is the protect information for protecting these memory cell MCs. By referring to the protect information, the microcomputer 2 can determine whether or not data should be updated or erased in the memory cell MC instructed to be accessed.

Figure 3:
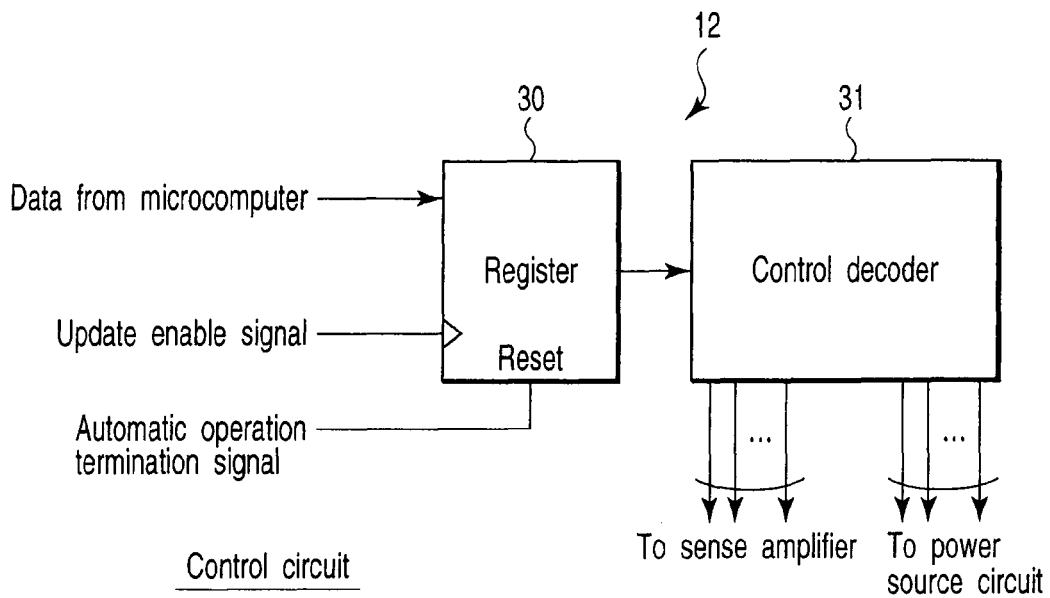
FIG. 3 is a circuit diagram of a control circuit according to the first embodiment of the present invention.

The control circuit 12 directly controls the operations of the power source circuit 11 and the sense amplifier 6 following the control of the microcomputer 2. FIG. 3 is a block diagram showing the configuration of the control circuit 12.

As shown in the Figure, the control circuit 12 includes a register 30 and a control decoder 31. The register 30 holds data (instruction) given from the microcomputer 2. An automatic operation termination signal is given to the register 30 as a reset signal. The automatic operation termination signal is a signal given from the microcomputer 2 and "0" when the aforementioned automatic operation mode is selected and "1" when the non-automatic operation mode is selected. When the automatic operation termination signal is "1", the register 30 is reset. An update enable signal is given to the register 30 from the microcomputer 2. When the update enable signal is "1", the register 30 can fetch data into the inside. The control decoder 31 decodes an instruction held by the register 30. Then, the operations of the power source circuit 11 and the sense amplifier 7 are controlled based on data obtained by decoding.

The flash memory configured as described above has the following effect (1).

(1) Acceleration of Operating Speed of Semiconductor Memory Device (No. 1).

The automatic operation of the flash memory is achieved by a method using a state machine circuit or a logic circuit or a method by control by the microcomputer. Because the command can be given to plural circuit blocks at the same time when the logic circuit is used for control, the operating speed of the flash memory can be improved; however, the quantity of wirings is large and the wiring system is complicated.

The control by the microcomputer can reduce the quantity of wirings largely as compared to the control by the logic circuit. However, the microcomputer cannot give any command to the plural circuit blocks at the same time. Further, because the bit count which can be handled is limited, sometimes, plural instructions or data need to be given several times in order to perform a single operation. Thus, the operating speed is slow as compared to the control by the logic circuit.

According to this embodiment, the circuit block which performs a specified routine processing, such as a voltage generating operation and verification operation in the sense amplifier, is controlled using hardware instead of the microcomputer. More specifically, the control circuit 12 is provided as well as the microcomputer 2. The control circuit 12 incorporates a decoder (logic circuit) configured to execute the voltage generating operation or the verification operation. The decoder receives and decodes a instruction with several bit (for example, 8 bits) given from the microcomputer 2 to generate a complicated control instruction of 8 bits or more. The decoder controls the power source circuit 11 and the sense amplifier 7 using generated control instruction. That is, the microcomputer 2 does not provide all the signals necessary for generation of voltage and verification operation and the control circuit generates a detailed control signal. Thus, for the control of the power source circuit 11 and the sense amplifier 7, the processing by the microcomputer 2 can be minimized to improve the operating speed of the flash memory.

Further, the microcomputer 2 does not output a number of signals, so that spare time for processing increases as compared to a conventional example. Thus, another instruction can be executed in such created spare time. As a result, the microcomputer 2 can execute a larger number of instructions as compared to the conventional example, thereby achieving acceleration of the flash memory.

Second Embodiment

Figure 4:
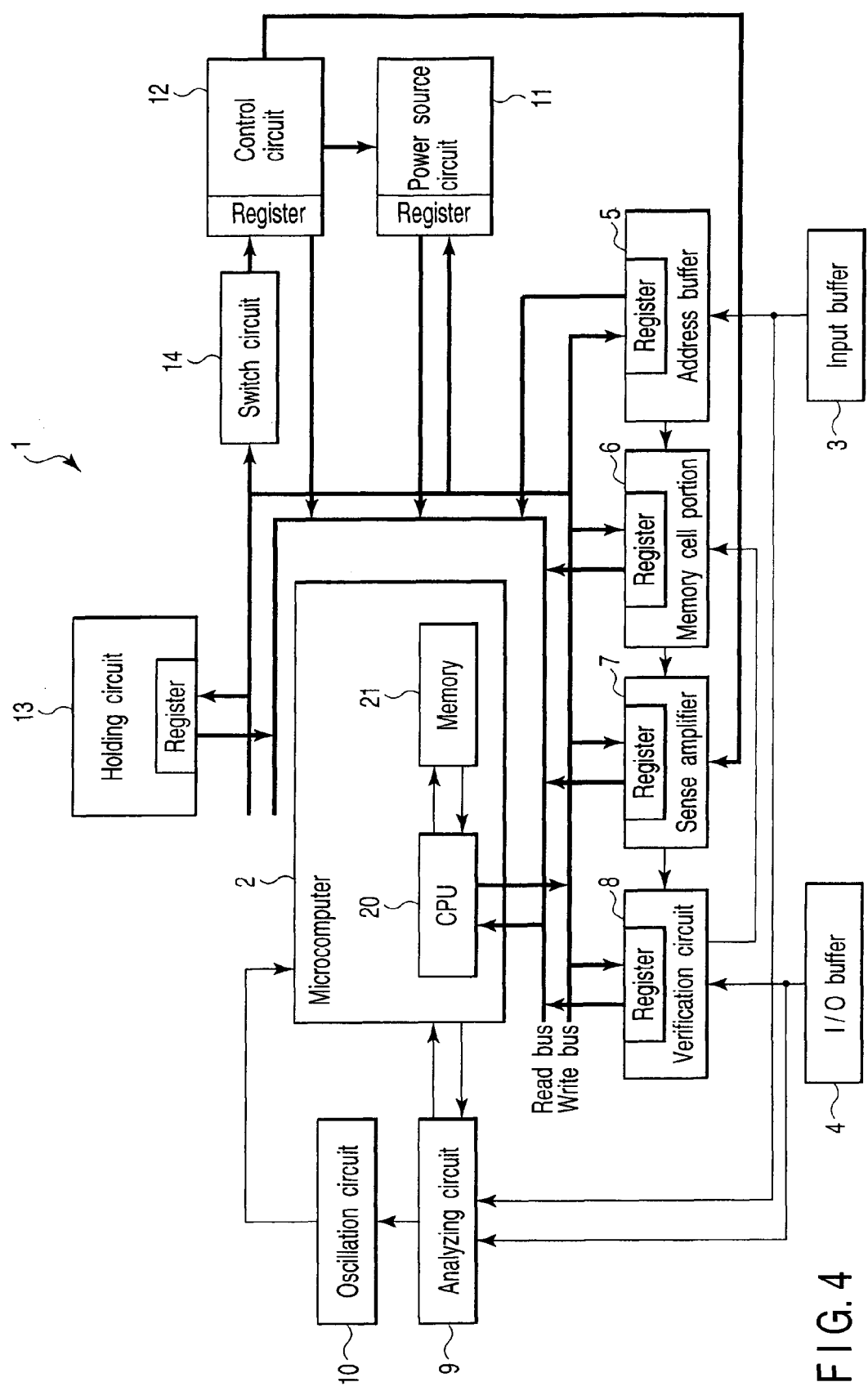
FIG. 4 is a block diagram of a flash memory according to a second embodiment of the present invention.

Next, a semiconductor memory device of according to a second embodiment of the present invention will be described. This embodiment concerns a method of controlling the power source circuit 11 when the flash memory makes transition to the automatic operation mode from the non-automatic operation mode in the first embodiment. FIG. 4 is a block diagram showing the configuration of the NOR type flash memory of this embodiment.

As shown in the Figure, the flash memory 1 of this embodiment includes the configuration of FIG. 1 described as the first embodiment with a switch circuit 14. The switch circuit 14 switches an instruction to be input to the control circuit 12. The other configuration is the same as that in the first embodiment and description thereof is omitted.

The switch circuit 14 will be described with reference to FIG. 5. FIG. 5 is a block diagram showing the configuration of the control circuit 12 and the switch circuit 14.

As shown in FIG. 5, the switch circuit 14 includes a selection circuit 40, an updating circuit 41, and a register value decoder 42. The selection circuit 40 selects any one of data (instruction) from the microcomputer 2 and startup decode value based on an output signal of the register value decoder 42. Then, any one selected is given to the register 30 of the control circuit 12. The data from the microcomputer 2 is an operation instruction of the control circuit 12 by the microcomputer 2. The startup decode value is an instruction for starting (or booting) a charge pump circuit in the power source circuit 11. Therefore, when the startup decode value is given, the control circuit 12 instructs the power source circuit 11 to start the charge pump circuit. The startup decode value may be a signal always given to the selection circuit 40 by a memory device such as a register, or may be a signal given together with the automatic operation command from outside. That is, a command factor signal input from outside may be decoded by the analyzing circuit 9 to generate the startup decode value and the startup decode value may be given to the switch circuit 14.

The register value decoder 42 decodes an output signal (that is, an instruction held in the register 30) of the register 30 in the control circuit 12. If the register 30 is in reset state as a result of decode, decoder 42 outputs "1" and otherwise, outputs "0". If the output of the register value decoder 42 is "1", the selection circuit 40 selects the startup decode value and if it is "0", data from the microcomputer 2 is selected.

The updating circuit 41 includes an OR gate 43 and an AND gate 44. The OR gate 43 executes OR operation between an output signal of the register value decoder 42 and an update enable signal given from the microcomputer 2. The update enable signal is a signal which is "1" when the microcomputer 2 instructs the register 30 to fetch data. The AND gate 44 executes AND operation between the output signal of the OR gate 43 and a clock given from the oscillation circuit 10. Then, the output signal of the AND gate 44 is given as the update instruction to the register 30 in the control circuit 12. That is, if the output of the AND gate 33 is "1", the register 30 fetches an instruction selected by the selection circuit 40. Consequently, the control decoder 31 controls the power source circuit 11 based on an instruction fetched into the register 30.

Figure 6:
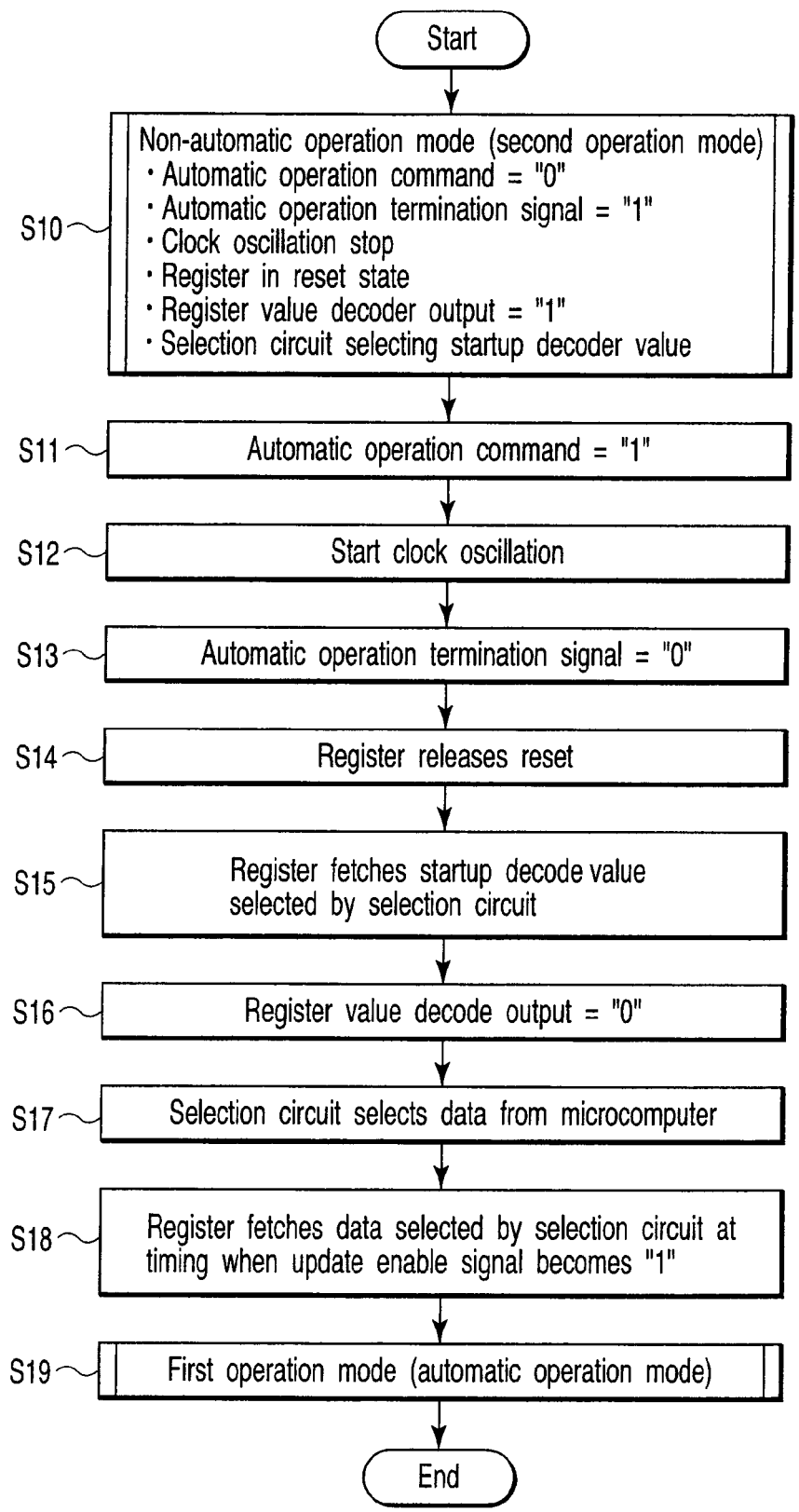
FIG. 6 is a flow chart showing an operation of the flash memory according to the second embodiment of the present invention.

Next, the operation of the flash memory 2 having the above-described configuration will be described with reference to FIGS. 4 to 7 particularly by paying attention to a transition from the non-automatic operation mode (second operation mode) to the automatic operation mode (first operation mode). FIG. 6 is a flow chart showing an operation of the flash memory and FIG. 7 is a timing chart showing statuses of various signals and the register 30.

Figure 7:
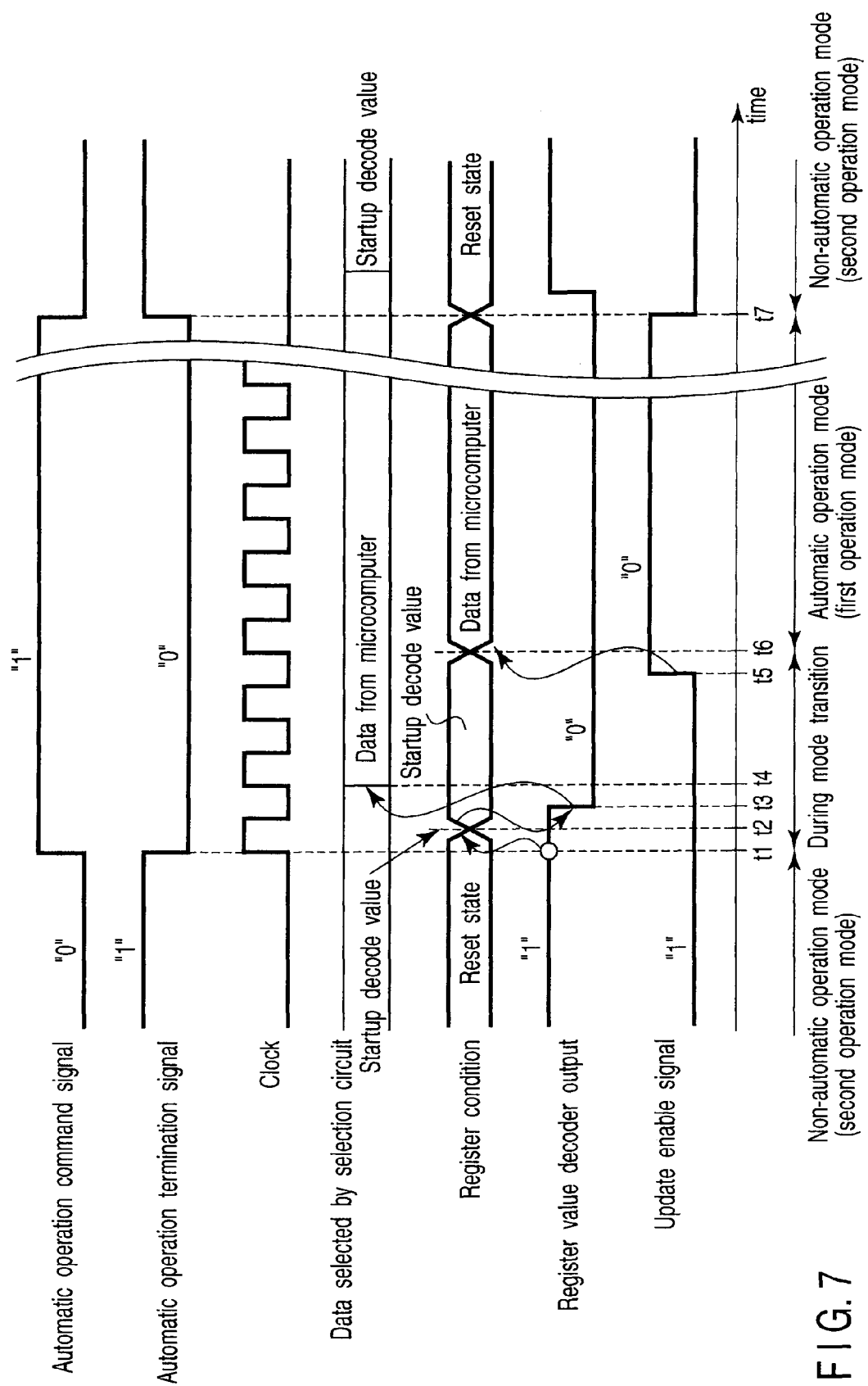
FIG. 7 is a timing chart of various kinds of signals when the flash memory is operated according to the second embodiment of the present invention.

First, it is assumed that the flash memory 1 is in the non-automatic operation mode (in step S10 and before time t1 in FIG. 7). Under the non-automatic operation mode, the automatic operation command is specified as "0". The automatic operation command is an instruction given from outside and an instruction for operating the flash memory 2 on the automatic operation mode. When the automatic operation command is specified as "0", the analyzing circuit 9 recognizes that it should operate under the non-automatic operation mode and notifies the oscillation circuit 10 and the microcomputer 2 thereof. Consequently, the oscillation circuit 10 stops generation of clock. The microcomputer 2 specifies the automatic operation termination signal as "1". When the automatic operation termination signal is specified as "1", the register 30 of the control circuit 12 is reset. Further, because the register 30 is reset, the output of the register value decoder 42 is "1". Therefore, the selection circuit 40 selects a startup decode value and gives it to the register 30. However, because the output of the AND gate 44 is "0" at this time, the register 30 does not fetch the startup decode value given from the selection circuit 40. As a result, the microcomputer 2 is in the non-operating state, so that the flash memory 2 is operated on the non-automatic operation mode.

Next, it is assumed that "1" is input as the automatic operation command at time t1 for transition from the non-automatic operation mode to the automatic operation mode (step S11). Then, the analyzing circuit 9 recognizes that it should be operated on the automatic operation mode and notifies the oscillation circuit 10 and the microcomputer 2 thereof. Consequently, the oscillation circuit 10 generates a clock (step S12). The microcomputer 2 specifies the automatic operation termination signal as "0" (step S13). When the automatic operation termination signal is "0", the register 30 in the control circuit 12 is released from the reset state (step S14). FIG. 7 describes a timing in which the automatic operation command signal is changed from "0" to "1" and a timing in which the automatic operation termination signal is changed from "1" to "0". However, usually, the change timing of the automatic operation termination signal is delayed because a specified time is needed for the microcomputer 2 to be started.

Consequently, the output of the AND gate 44 is "1". That is, because the output of the register value decoder 42 is "1", the output of the OR gate 43 is "1". Because a clock is generated in that condition, the output of the AND gate 44 is "1". As a result, the register 30 fetches the startup decode value given from the selection circuit 40 (step S15, time t2).

When the register 30 fetches the startup decode value, the control decoder 31 decodes the startup decode value and instructs the power source circuit 11 to start the charge pump circuit. At the same time, the register 30 is released from the reset state and thus the output of the register value decoder 42 turns to "0" (step S16, time t3).

When the output of the register value decoder 42 is changed to "0", the selection circuit 40 comes to fetch data from the microcomputer (step S17, time t4). Because the output of the register value decoder 42 is "0" at this time, the output of the OR gate 43 is "0" and the register 30 does not fetch data of the microcomputer. As a result, preparation for the power source circuit 11 to operate under the automatic operation mode is completed.

At a timing when the update enable signal given from the microcomputer 2 turns to "1", the register 30 fetches data from the microcomputer 2 (step S18, time t5, t6). Consequently, the flash memory is operated on the automatic operation mode (step S19). After that, when the register 30 fetches data from the microcomputer 2 at a timing of the update enable signal, the operation of the control circuit 12 is controlled by the microcomputer 2.

The transition from the automatic operation mode to the non-automatic operation mode is carried out as follows. First, the automatic operation command is specified as "0". As a result, the oscillation circuit stops the generation of the clock. Further, the automatic operation termination signal is specified as "1" and the update enable signal is fixed to "0". As a result, the register 30 is in the reset state, so that the output of the register value decoder 42 turns to "1", thereby prohibiting updating of the register 30. Then, the startup decode value of the selection circuit 40 is selected. As a result, the control circuit 12 is operated without any control by the microcomputer 2.

As described above, the semiconductor memory device according to the second embodiment of the invention obtains the following effect (2) as well as the effect (1) described in the first embodiment.

(2) Improvement of Operating Speed of Semiconductor Memory Device (No. 2).

One of demerits (overhead) that the processing of the automatic operation of the flash memory as compared to the control by the logic circuit is delay of startup of the charge pump circuit.

In the flash memory, usually, the charge pump circuit is in the non-operating condition except when the automatic operation mode is selected. This aims at preventing reduction of power consumption and generation of noise source. Therefore, when the automatic operation command is input to the flash memory, first, the charge pump circuit needs to be started. It takes a relatively long time when the start of the charge pump circuit is carried out by the microcomputer for the following reasons. That is, the microcomputer 2 is not operated until just before the non-automatic operation mode is changed to the automatic operation mode. Therefore, the start of the charge pump circuit is carried out by:

(a) analyzing automatic operation command input from outside with the analyzing circuit 9;

(b) as a result of analysis, microcomputer 2's starting its operation; and (c) microcomputer 2's reading a charge pump circuit startup instruction after its operation is started.

That is, even if the automatic operation command is input, it is difficult to dispatch the startup instruction immediately and usually, it takes several hundreds ns since the automatic operation command is input.

The charge pump circuit cannot be started immediately just after a start instruction is given and it needs some time for the charge pump circuit to be started. Thus, under the control by the microcomputer 2, time until the charge pump circuit is enabled to be operated since the automatic operation command is input, that is, time until the flash memory is enabled to perform automatic operation is increased.

According to the configuration of this embodiment, the startup decode value which is an instruction for starting the charge pump circuit is given to the control circuit 12 independently of the control of the microcomputer 2. Then, a signal which serves as trigger for fetching the startup decode value is given by the register value decoder 42 and the updating circuit 41 of the switch circuit 14. That is, if the timing for fetching an instruction of the register 30 relies upon an update enable signal which is given from the microcomputer 2, the start of the charge pump circuit is delayed even if the startup decode value is given from other than the microcomputer 2. Thus, according to this embodiment, as the timing for fetching an instruction of the register 30, the output of the register value decoder 42 is used by using a fact that the register 30 is in the reset state under the non-automatic operation mode. Consequently, it becomes possible to input the startup decode value to the register 30 earlier than the microcomputer 2 becomes enabled to be operated, and as a result, the charge pump circuit can be started up quickly. Consequently, the high speed operation of the flash memory is enabled.

Third Embodiment

Figure 8:
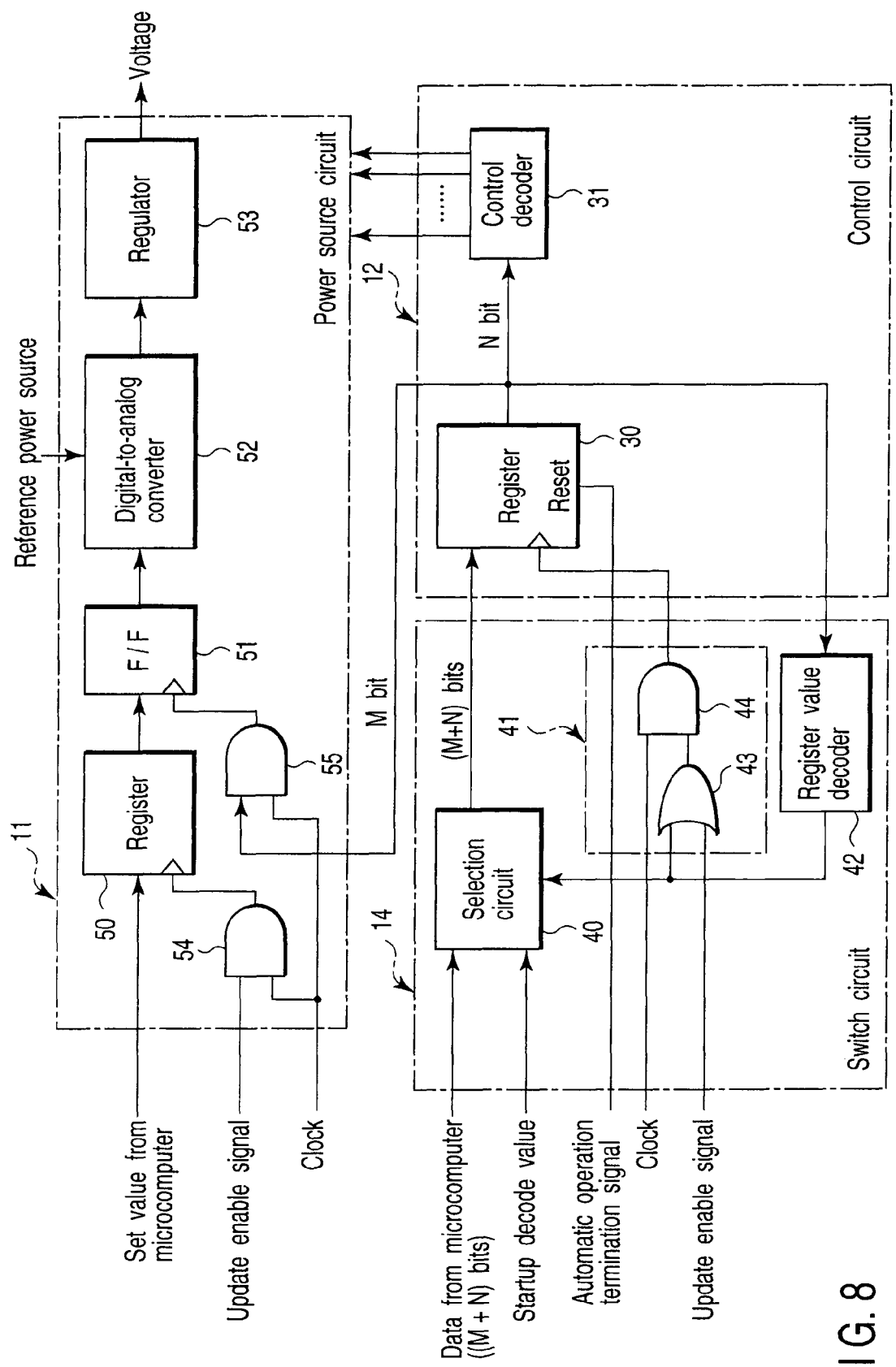
FIG. 8 is a circuit diagram of a switch circuit, control circuit and power source circuit according to a third embodiment of the present invention.

Next, a semiconductor memory device according to a third embodiment of the present invention will be described. This embodiment concerns voltage updating timing in the power source circuit 11 of the second embodiment. Description of the flash memory 2 is omitted because the entire configuration thereof is the same as shown in FIG. 4 of the second embodiment and then, only different points from the first and second embodiments will be described. FIG. 8 is a block diagram showing the configuration of the control circuit 12, the switch circuit 14 and the power source circuit 11 included in the flash memory 1.

Data given to the switch circuit 14 from the microcomputer 2 is (M+N), which is 8 bits, where for example, M=1 bit and N=7 bits. For example, M bit is 1 bit which is the highest bit of the 8 bits and N bit is lower 7 bits of the 8 bits. Of these (M+N) bits, N bit data is control information of the power source circuit 11 and used in the control circuit 12. On the other hand, data of the M bit is used as information of the update timing of the output voltage in the power source circuit 11. Of course, the bit count is not limited to the aforementioned one.

As shown in the figure, the power source circuit 11 includes a register 50, flip-flop 51, digital-to-analog converter, regulator 53 and AND gates 54, 55. The register 50 holds a set value given from the microcomputer 2. The set value is data corresponding to the value of a voltage to be generated by the power source circuit 11. The flip-flop 51 holds a set value, which is transferred from the register 50. The digital-to-analog converter 52 is supplied with reference power in order to convert the set value held by the flip-flop 51 from digital value to analog value. The regulator 53 generates a voltage corresponding to the set value and outputs the voltage, according to the value obtained by the digital-to-analog converter 52. The AND gate 54 executes AND operation between the clock and the update enable signal. The register 50 fetches the set value at a timing when the result of arithmetic operation of the AND gate 54 is "1". The AND gate 55 executes AND operation between the clock and the M bit of data held by the register 30 of the control circuit 12. Then, the flip-flop 51 fetches the set value at a timing when the result of arithmetic operation of the AND gate 55 is "1".

Figure 9:
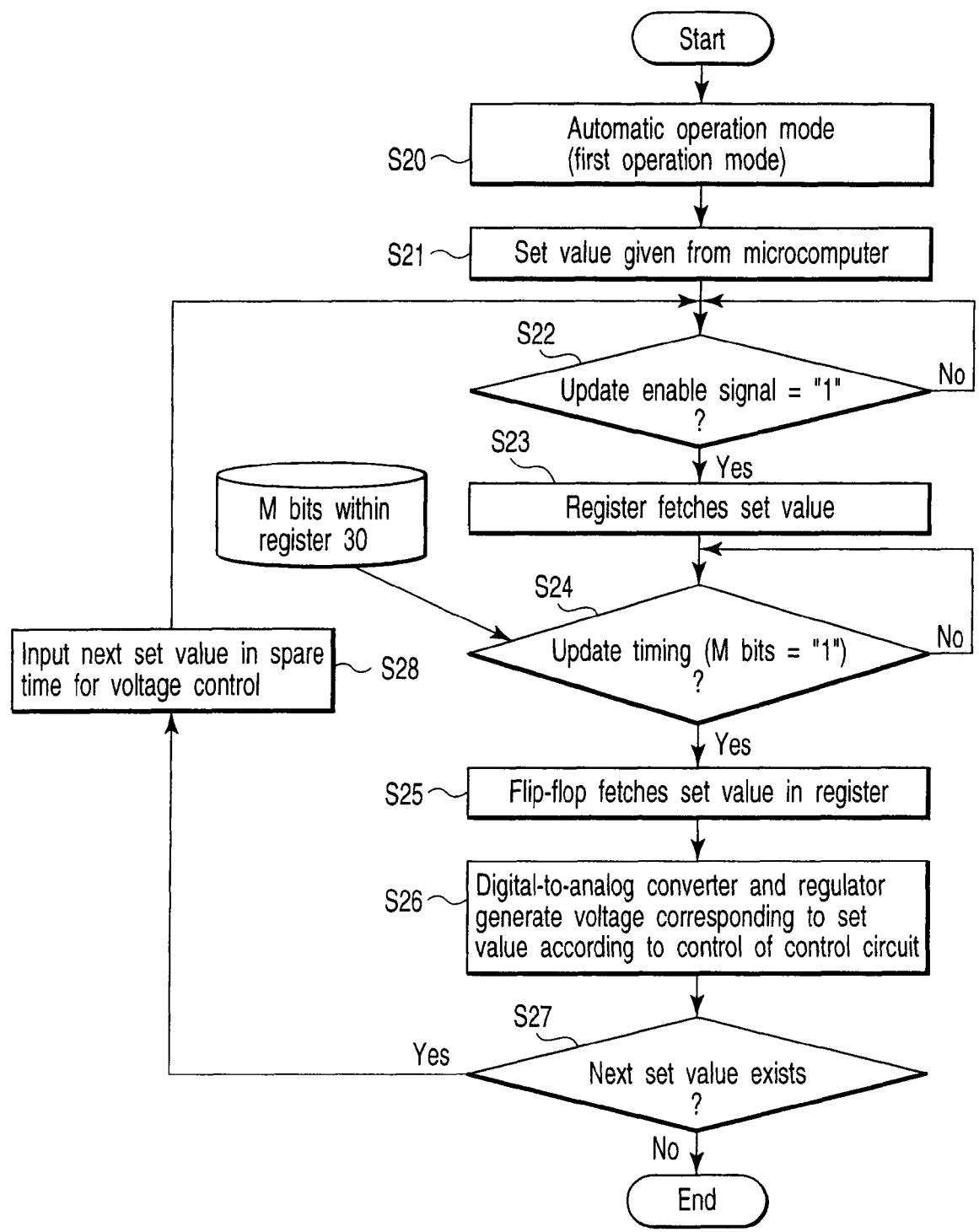
FIG. 9 is a flow chart showing an operation of a flash memory according to the third embodiment of the present invention.

Next, the operation of the power source circuit 11 having the above-described configuration will be described with reference to FIG. 9. FIG. 9 is a flow chart showing the operation of the power source circuit.

As shown in FIG. 9, under the automatic operation mode (step S20), the set value is given to the register 50 from the microcomputer 2 (step S21). If the update enable signal is "1" (step S22:YES), the output of the AND gate 54 is "1" and thus the set value is fetched into the register 50 (step S23). In the case of the update timing, that is, if the M bit of an instruction held by the register 30 is "1" (step S24:YES), the output of the AND gate 55 is "1" and thus the set value is fetched into the flip-flop 51 (step S25). A voltage is generated by the digital-to-analog converter 52 and the regulator 53 according to the set value held by the flip-flop 51 (step S26). Further, if there is a next set value (step S27:YES), the next set value is given to the register 50 by the microcomputer 2 within the spare time for voltage control (step S28) and operation subsequent to step S22 is repeated.

A specific example of the above-described operation will be described with reference to FIG. 10. FIG. 10 is a timing chart showing transition of an instruction in the register 30, the set value in the register 50 and the flip-flop 51 of the power source circuit 11 and the output voltage of the regulator 53.

As shown in FIG. 10, assume that an instruction of voltage control 1 using voltage V2 is given to the register 30 at time t10, a set value V2 is given to the register 50 and M bit of the instruction of the voltage control 1 is "1" (update timing). Then, the set value V2 in the register 50 is given to the flip-flop 51 and the voltage V2 is output by the regulator 53.

Next, assume that the microcomputer 2 inputs a next set value V3 to the register 50 at time t11 within the spare time for control. Then, although the set value V3 is fetched into the register 50, it is not fetched into the flip-flop 51 because it is not update timing.

Next, an instruction of voltage control 2 using the voltage V2 is given to the register 30 at time t12. Because this instruction does not change the voltage, the M bit of the instruction of the voltage control 2 is "0". Therefore, the set value V3 in the register 50 is not fetched into the flip-flop 51 and the regulator 53 continues to output the voltage V2.

Next, an instruction of voltage control V3 using the voltage V3 is given to the register at time t13. Because this instruction accompanies change of the voltage, the M bit of the instruction of the voltage control 3 is "1". That is, the set value V3 in the register 50 is fetched into the flip-flop 51 because it is the update timing. Consequently, the regulator 53 changes the output voltage from V2 to V3 and outputs it.

As described above, the semiconductor memory device according to the third embodiment of the invention can obtain the following effect (3) as well as the effects (1), (2) described in the first and second embodiments.

(3) Improvement of Operating Speed of Semiconductor Memory Device (No. 3).

Various values of the voltages are needed for write, erase or read during the automatic operation of the flash memory. The change of the voltage is often carried out at a timing of updating the register 30 in the control circuit 12.

In the configuration of this embodiment, the register 50 and the flip-flop 51 capable of holding the set values are provided in series in the power source circuit 11. The respective set value fetch timings are differentiated. More specifically, the set value is fetched in at a timing of the update enable signal in the register 50 on a pre-stage. Further, the set value is fetched based on part of bits in an instruction held by the register 30 in the flip-flop 51 on a post stage. For this purpose, part of the bits of an instruction held by the register 30 is supplied with not the content of control of the power source circuit 11 by the control circuit 12 but a meaning which serves as trigger for updating of the voltage of the voltage circuit 11. Additionally, the microcomputer 2 inputs a next set value to the register 50 in a period having a small amount of processing. Even if a new set value is input to the register 50, the output voltage of the power source circuit 11 is never changed until the aforementioned trigger in an instruction of the register 30 is established.

As described above, the microcomputer 2 can input the set value into the power source circuit 11 in the spare time and prepare the set value in the power source circuit 11. As a result, load on the microcomputer 2 is reduced and the processing efficiency of the microcomputer 2 is improved, so that the power source circuit 11 can change the voltage rapidly. Consequently, the operating speed of the flash memory can be improved.

Fourth Embodiment

Figure 11:
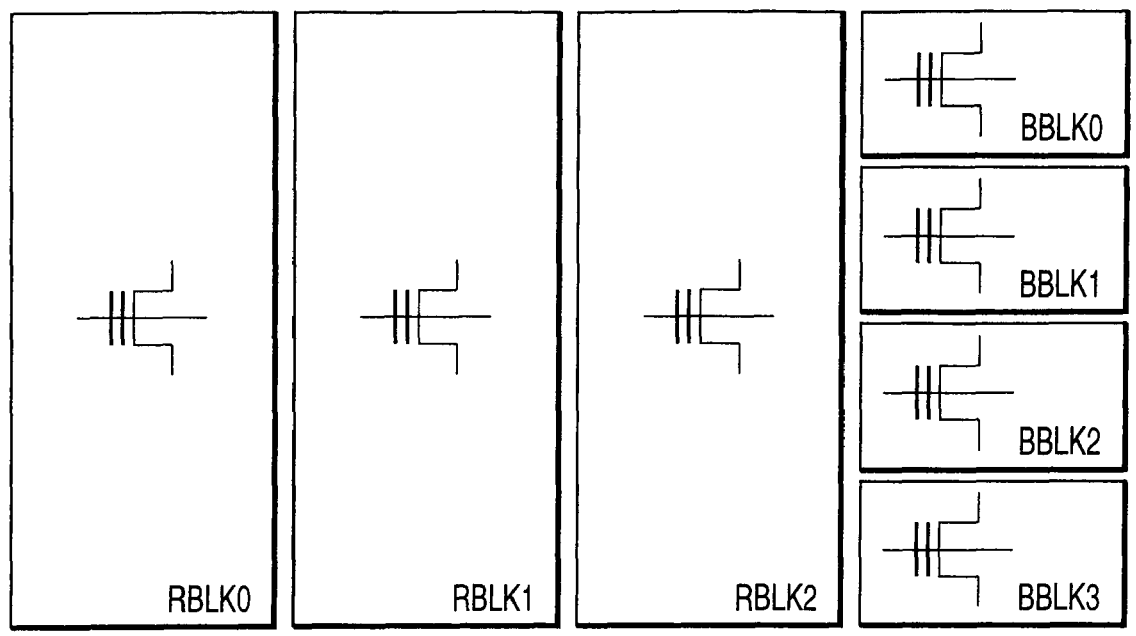
FIG. 11 is a block diagram of a memory cell array according to a fourth embodiment of the present invention.

Next, a semiconductor memory device according to a fourth embodiment of the present invention will be described. This embodiment concerns the configuration and operation of the verification circuit 8 in any of the first to third embodiments. Hereinafter, only different points from the first to third embodiments will be described. FIG. 11 is a block diagram of a memory cell array included in the memory cell portion 6 of the flash memory 1 of this embodiment.

As shown in FIG. 11, the memory cell array has three regular blocks RBLK0 to RBLK2 and four boot blocks BBLK0 to BBLK3. Hereinafter if the regular blocks RBLK0 to RBLK2 are not differentiated, the regular blocks will be called just regular block RBLK and if the boot blocks BBLK0 to BBLK3 are not differentiated, the boot blocks will be called just boot block BBLK. If the regular block RBLK and the boot block BBLK are not distinguished, they will be called just block.

The regular block RBLK and the boot block BBLK are a group of the memory cell MCs. The data held in the memory cell MCs in each block are erased at a time. That is, the block size is equal to erase unit. A difference between the regular block RBLK and the boot block BBLK is memory size and application field. As for the memory size, the regular block RBLK has a larger size than the boot block BBLK and the memory size of the regular block RBLK is equal to the memory size of four boot blocks BBLK. Next, as for the application field, the regular block RBLK is used as a storage for data which is rewritten frequently by a user, such as images and sound. On the other hand, although the boot block BBLK is used as a storage for start program of the circuit block or the like which has small data size and is important data for the system.

Figure 12:
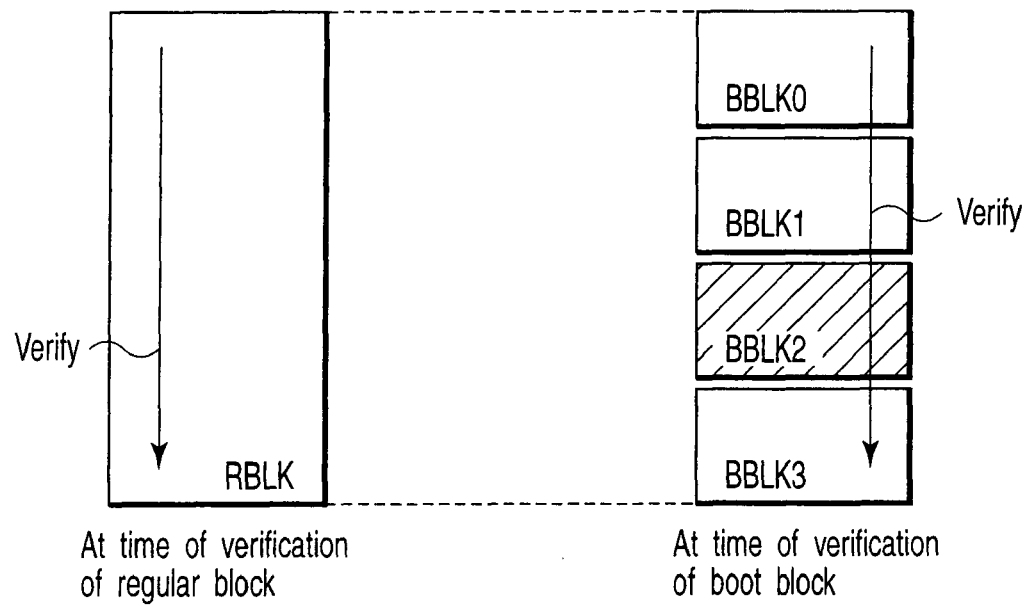
FIG. 12 is a block diagram of the memory cell array according to the fourth embodiment of the present invention, showing the concept of a verification operation.

Next, the verification operation of the regular block RBLK and the boot block BBLK by the verification circuit 8 will be described simply with reference to FIG. 12. FIG. 12 is a conceptual diagram showing the regular block RBLK and the boot block BBLK, indicating an access status at the time of a verification operation.

As shown in FIG. 12, the verification operation is carried out in the size of the regular block RBLK regardless of the regular block RBLK and boot block BBLK. In this example of the embodiment, the memory size of one regular block RBLK is equal to the memory size of four boot blocks BBLK. Thus, if erase of the boot block BBLK2 and verification of the erase thereof are carried out, verification of erase of all four boot blocks BBLK0 to BBLK3 is carried out.

Next, the configuration of the verification circuit 8 included in the flash memory 1 of this embodiment will be described with reference to FIG. 13. FIG. 13 is a circuit diagram of the verification circuit 8.

As shown in FIG. 13, the verification circuit 8 includes registers 60-0 to 60-3, 65, determination circuit 62, output circuit 63 and comparison circuit 64.

The registers 60-0 to 60-3 set a flag indicating selection/non-selection of the boot block BBLK based on a boot block selection signal given from the microcomputer 2. The registers 60-0 to 60-3 correspond to the respective boot blocks BBLK0 to BBLK3. when the data is updated (write or erase) in any one of the boot blocks BBLK0 to BBLK3 and verification is needed, "1" is held in any one of the corresponding registers 60-0 to 60-3 and "0" is held in the others. The boot block BBLK in which data is updated actually is called selected boot block BBLK depending on a case below.

For example, assume that data in the boot block BBLK2 is updated. In this case, the selected boot block is the boot block BBLK2. Thus, as described in FIG. 12, the verification is executed for all the four boot blocks BBLK0 to BBLK3 and only the register 60-2, which corresponds to BBLK2, sets the flag. Therefore, only the register 60-2 holds "1" and the other registers 60-0, 60-1 and 60-3 hold "0".

The determination circuit 62 determines whether or not the memory cell MC in which verification is executed is contained in the selected boot block BBLK. The determination circuit 62 includes AND gates 70-0 to 70-3 and a NOR gate 71. The AND gates 70-0 to 70-3 execute AND operation between an address signal indicating the boot blocks BBLK0 to BBLK3 and a flag held by the registers 60-0 to 60-3. An address signal indicating the boot blocks BBLK0 to BBLK3 is a signal which is given from the microcomputer 2 and indicates a block address of the memory cell MC holding read data in which verification is executed. That is, if the memory cell MC is contained in the boot block BBLK0, an address signal indicating the boot block BBLK0 is "1" and if it is contained in the boot block BBLK1, an address signal indicating the boot block BBLK1 is "1". The NOR gate 71 executes NOR operation between the output of the AND gates 70-0 to 70-3 and a regular block selection signal. The regular block selection signal is given from the microcomputer 2 and set to "1" if data of the regular block RBLK is updated and "0" in other cases.

Assume that as described above, the data in the boot block BBLK2 is updated. Then, when the memory cell MC contained in the boot block BBLK2 is verified, the address signal indicating the boot block BBLK2 is "1" and the output of the AND gate 70-2 is "1". The outputs of the other AND gates 70-0, 70-1, 70-3 are "0" and the output of the NOR gate 71 is "0".

If data in the regular block RBLK is updated, the output of the NOR gate 71 is "0".

On the other hand, if the memory cell MCs contained in the boot blocks BBLK0, BBLK1 and BBLK3 are verified, the address signal indicating the boot blocks BBLK0, BBLK1 and BBLK3 is "1". However, because the registers 60-0, 60-1 and 60-3 hold "0", the outputs of all the AND gates 70-0 to 70-3 are "0" and the output of the NOR gate 71 is "1".

The comparison circuit 64 compares data read by the sense amplifier 6 with write original data ("1" in case of erase) so as to determine whether or not accurate data is held in the memory cell MC. If both of them coincide as a result of the comparison, "1" is output and otherwise, "0" is output.

The register 65 holds the comparison result of the comparison circuit 64. The register 65 fetches the comparison result according to a verification result update signal given from the microcomputer 2 and is reset by a verification result reset signal.

The output circuit 63 outputs a verification result and write data based on the output of the determination circuit 62 and a comparison result held in the register 65. The output circuit 63 includes AND gates 80, 81 and OR gate 82. The AND gate 80 executes AND operation between the comparison result held by the register and an inversion signal of the output of the NOR gate 71. The OR gate 82 executes OR operation between the output of the AND gate 80 and the output of the NOR gate 71. Then, an operation result of the OR gate 82 is output as a final verification result. The AND gate 81 executes OR operation between the write original data and the inversion signal of the output of the NOR gate 71.

Therefore, if all the outputs of the AND gates 70-0 to 70-3 are "0" and the output of the NOR gate 71 is "1", the output (verification result) of the NOR gate 82 is forced to be "1", that is, verification OK. Further, the output (write data) of the AND gate 81 is fixed to "0" forcibly. On the other hand, if the output of the NOR gate 71 is "0", the outputs of the NOR gate 82 and AND gate 81 depend on the comparison result and write original data held in the register 65.

Figure 14:
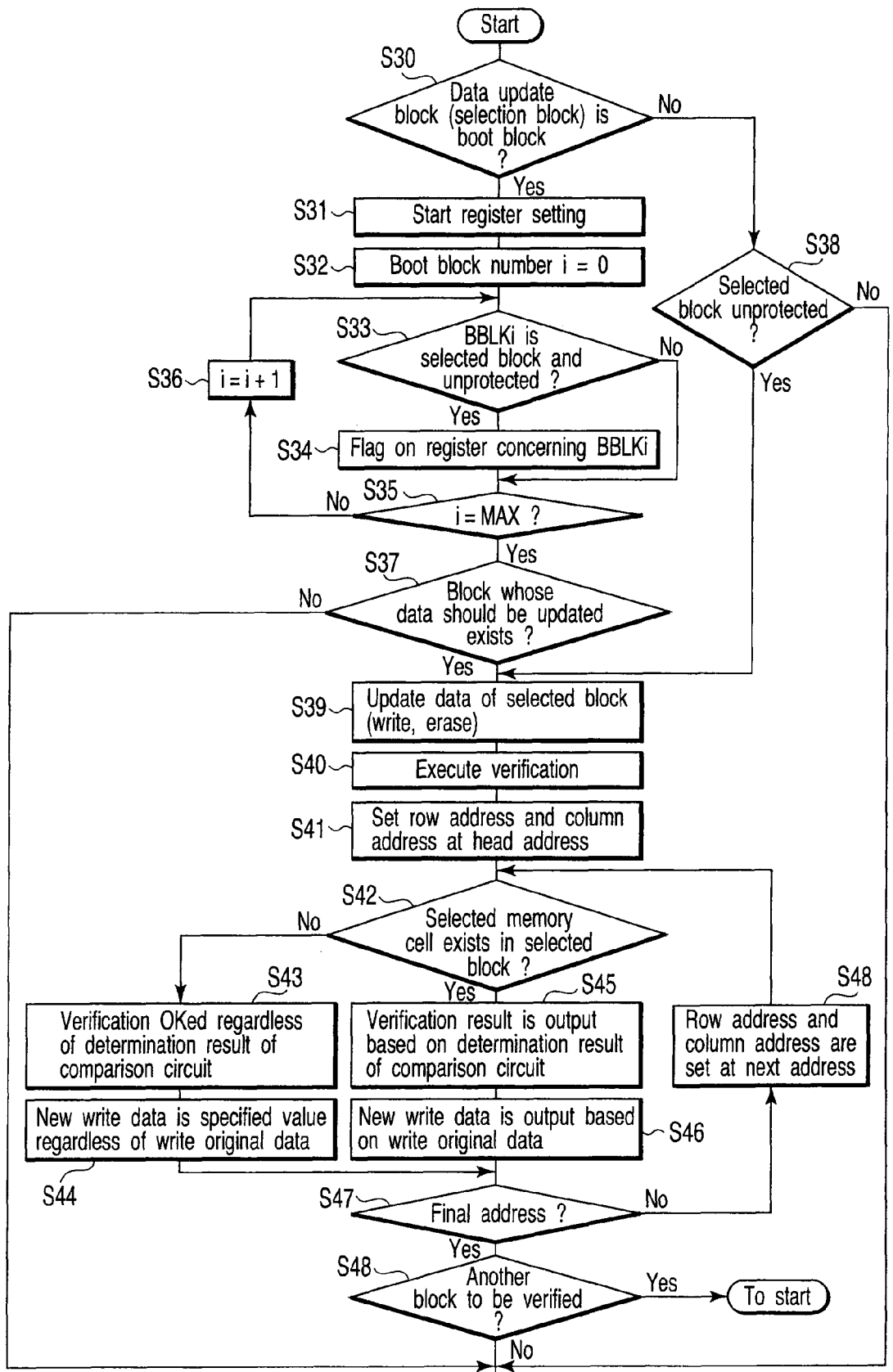
FIG. 14 is a flow chart showing an operation of a flash memory according to the fourth embodiment of the present invention.

The operation of the verification circuit 8 having the above-described configuration when data of the memory cell MC is updated will be described with reference to FIG. 14. FIG. 14 is a flow chart of the operation of the verification circuit 8. The boot block BBLK and regular block RBLK including a memory cell MC whose data is updated are called selected block depending on a case if they are not distinguished from each other.

If a block (selected block) whose data is to be updated is boot block BBLK (step S30: YES), the microcomputer 2 starts setting of the registers 60-0 to 60-3 (step S31). The microcomputer 2 sets a boot block number i to "0" (step S32) and determines whether or not the boot block BBLKi is a selected block and unprotected (step S33). Whether or not it is a selected block can be grasped by referring to an address signal and whether or not it is protected can be grasped by referring to protect information in the holding circuit 13.

Because data of a given block is updated if it is a selected block and not protected (step S33: YES), the microcomputer 2 set a flag on the registers 60-0 to 60-3 corresponding to that block (step S34). If data write or erase is carried out in the boot block BBLK2 as described above, the register 60-2 holds "1". Then, processing of steps S33 to S34 is repeated until i becomes a maximum value (because this embodiment has four boot blocks BBLK, i=4−1=3, step S35) (step S36).

The setting of the registers 60-0 to 60-3 is thus finished. If data is updated in any of the boot blocks BBLK, "1" is held in the corresponding registers 60-0 to 60-3. Of course, the number of the boot blocks BBLK which are to be updated is not restricted to 1 but may be plural. Further, even if one of the boot blocks BBLK is a selected block, if the boot block BBLK is protected, no data is updated and thus, the registers 60-0 to 60-3 corresponding to the given boot block BBLK continue to hold "0".

When a block whose data should be updated exists as a result of termination of step S35 (step S35: YES), or when the selected block is the regular block RBLK (step S30: NO) while the selected block is not protected (step S38: YES), data in the selected block is updated (step S39). That is, data write or erase is carried out in the selected block. If NO in steps S37, S38, the processing is terminated.

When the data update of step S39 is terminated, the verification operation is executed next (step S40). First, the microcomputer 2 sets the row address and column address at a head address (step S41).

For example, if the regular block RBLK0 is a selected block, the head address is an address corresponding to the head memory cell MC of the regular block RBLK0. The final address is an address corresponding to a final memory cell MC of the regular block RBLK0.

On the other hand, if one of the boot block BBLK is selected as shown in FIG. 12, the head address is an address corresponding to the head memory cell of the boot block BBLK0. The final address is an address corresponding to the final memory cell MC of the boot block BBLK3. This is because as described above, verification is executed about the four boot blocks BBLK0 to BBLK3.

Then, data is read from a memory cell MC (called selected memory cell) corresponding to the aforementioned address and compared by the comparison circuit 64. Consequently, whether or not data is updated properly in the selected memory cell is verified.

Further, whether or not a memory cell (selected memory cell) compared by the comparison circuit is contained in the selected block is determined (step S42). In this determination, the microcomputer 2 needs no processing. This is because the processing of step S42 is carried out by the determination circuit 62. If the output of the NOR gate 71 is "0", the selected memory cell is contained in the selected block and if it is "1", the selected memory cell is not contained in the selected block.

Figure 15:
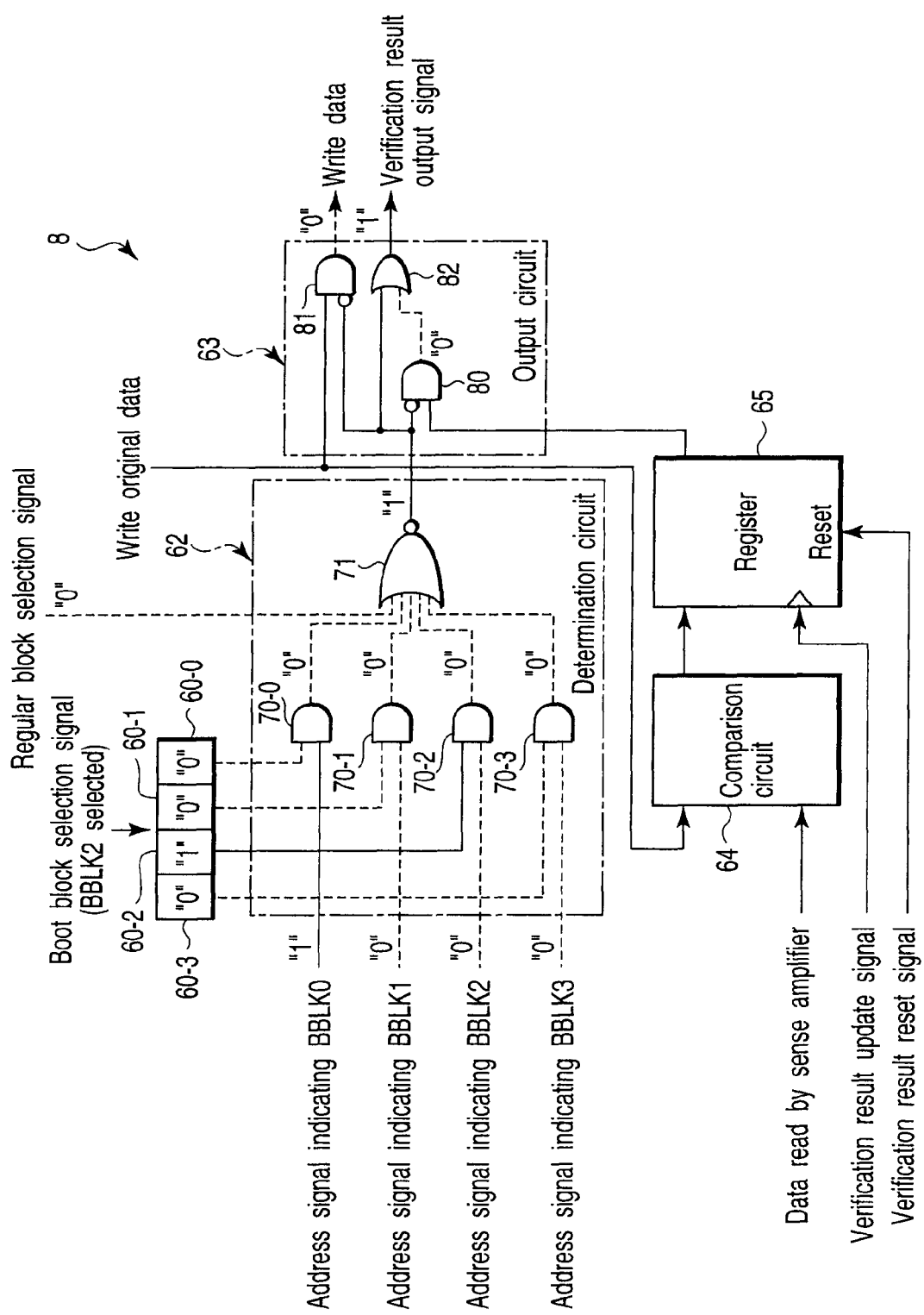
FIG. 15 and FIG. 16 are circuit diagrams of the verification circuit according to the fourth embodiment of the present invention.

First, a case where the selected memory cell is not contained in the selected block (step S42: No) will be described with reference to FIG. 15. FIG. 15 is a block diagram of the verification circuit 8, indicating a case where the selected block is the boot block BBLK2 and the selected memory cell MC is contained in the unselected boot block BBLK0.

As shown in the FIG. 15, "1" is held in the register 60-2 and "0" is held in the registers 60-0, 60-1 and 60-3. Naturally, the regular block selection signal is "0". Further, because the selected memory cell is contained in the boot block BBLK0, an address signal indicating the boot block BBLK0 is "1" and a signal indicating the boot blocks BBLK1 to BBLK3 is "0".

Consequently, the outputs of all the AND gates 70-0 to 70-3 are "0" in the determination circuit 62 and the output of the NOR gate 71 is "1". As a result, the output of the NOR gate 82 is "1" in the output circuit 63. That is, verification is OKed regardless of a comparison result held by the register 65 (step S43). The output of the AND gate 81 is fixed to a predetermined value forcibly (step S44). Although under the configuration of FIG. 15, the output of the AND gate 81 is fixed to "0", this value may be fixed to "1".

Figure 16:
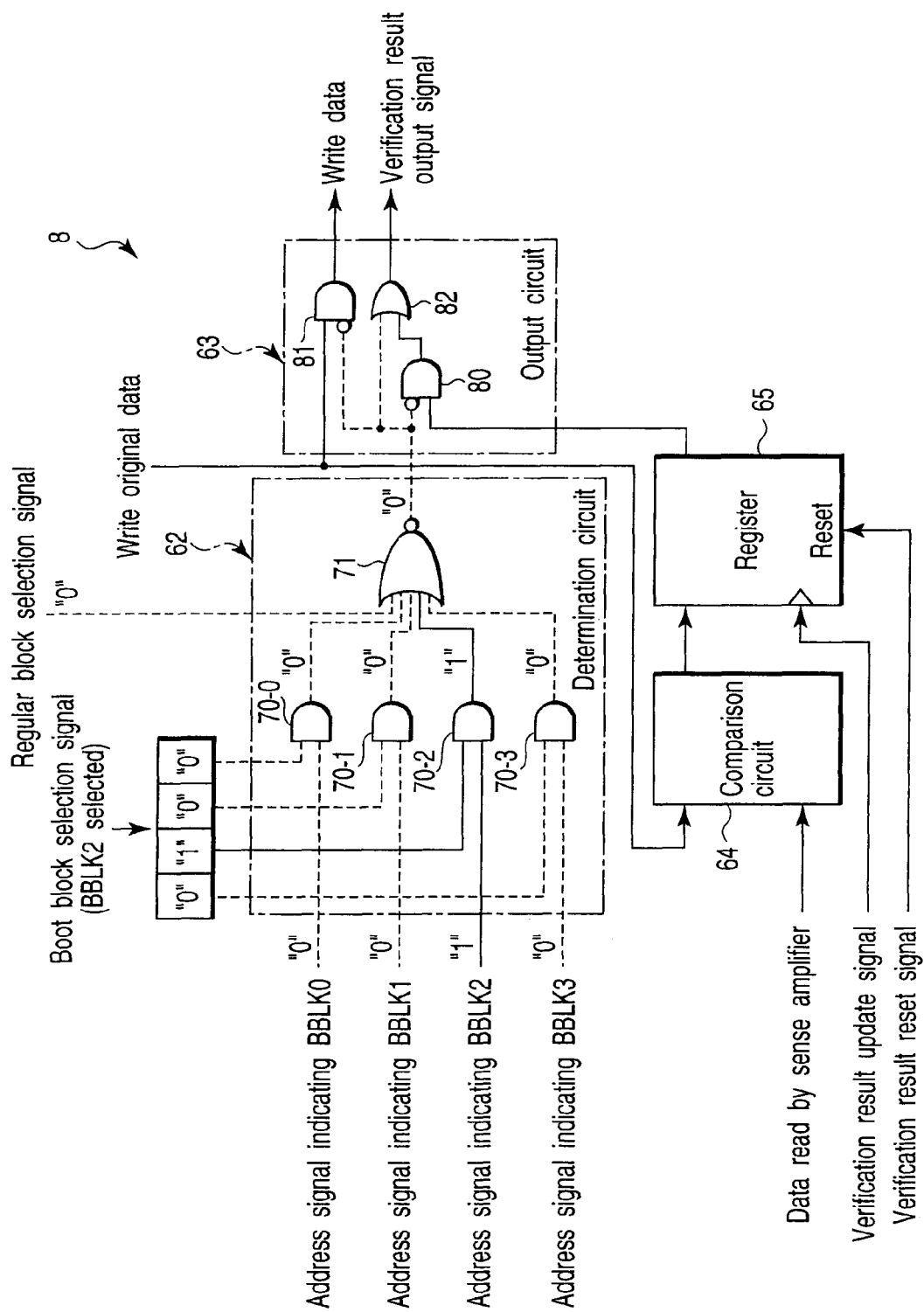

Next, a case where the selection memory cell is contained in the selected block (step S42: YES) will be described with reference to FIG. 16. FIG. 16 is a block diagram of the verification circuit 8, indicating a case where the selected block is the boot block BBLK2 while the selected memory cell MC is contained in the selected boot block BBLK2.

As shown in FIG. 16, because the selected memory cell is contained in the boot block BBLK2, the address signal indicating the boot block BBLK2 is "1". Therefore, the output of the AND gate 70-2 in the determination circuit 62 is "1" while the output of the NOR gate 71 is "0".

Thus, the output of the OR gate 82 in the output circuit 63 is determined depending on the output of the AND gate 80, that is, a comparison result held by the register 65. That is, when the comparison circuit outputs "1", verification is OKed and if it outputs "0", verification is wrong (step S45). The output of the AND gate 81 is determined by the write original data. That is, if the write original data is "1", the write data is "1" and if the write original data is "0", the write data is "0" (step S46).

In the meantime, if the regular block RBLK is a selected block, all the selected memory cells are contained in the selected block. This is because the regular block RBLK is a unit which executes verification. In this case, microcomputer 2 reflects the data held in the register 65 and the write original data to the output of the output circuit 63 by setting the regular block selection signal to "1".

After steps S44 and S46, if the row address and column address are not the final address (steps 47: NO), the microcomputer 2 sets the row address and column address to a next address (step S48) and the procedure returns to step S42. If the row address and column address reaches the final address (step S47: YES) and verification is executed in another block (step S48: YES), the procedure returns to step S30, in which the aforementioned processing is repeated. Unless the processing is executed (step S48: NO), the procedure is completed.

As described above, the semiconductor memory device according to the fourth embodiment of the invention can obtain the following effect (4) as well as the effects (1) to (3) described in the first to third embodiments.

(4) Improvement of Operating Speed of Semiconductor Memory Device (No. 4).

The boot block BBLK is a segmentation area of ¼ block size with respect to the regular block RBLK according to this embodiment. Generally, if verification is carried out in the boot block BBLK by the microcomputer 2, verification is executed only in the selected boot block BBLK.

However, the range to be verified naturally differs between the boot block BBLK and the regular block RBLK. Thus, according to the above-mentioned method, the microcomputer 2 needs to determine whether or not the given address exists within the selected boot block BBLK for each address. Further, if data is updated about plural boot blocks BBLK, after whether or not verification is terminated on a single boot block BBLK is determined, whether or not a next address exists in the boot block BBLK needs to be determined for each address. This processing is also needed when verification is carried out on the regular block RBLK. Usually, the determination processing by the microcomputer 2 includes at least two instructions, namely, arithmetic operation instruction and branch instruction. Therefore, in case of a 16-bit microcomputer 2, (determination processing twice)×two instructions=four instructions needs to be repeated 16,636 times. As a result, time of about 26 ms is needed to determine whether or not the given address indicates the boot block BBLK.

The configuration of this embodiment does not need the aforementioned four instructions, thereby achieving high speed verification operation. According to this embodiment, the unit for verification is specified to the regular block size as a common unit between the regular block RBLK and the boot block BBLK. If the selected block is the boot block BBLK, a comparison result in the comparison circuit 64 is reflected on a verification result of the selected boot block BBLK. Then, the verification result of the unselected boot block BBLK is forced to be OKed by the output circuit 63. The microcomputer 2 does not determine whether or not the selected memory cell is included in a selected boot block BBLK and this determination is carried out by the determination circuit 62 provided on the verification circuit 8. Consequently, load on the microcomputer 2 is reduced so as to improve the operating speed of the flash memory.

Figure 17:
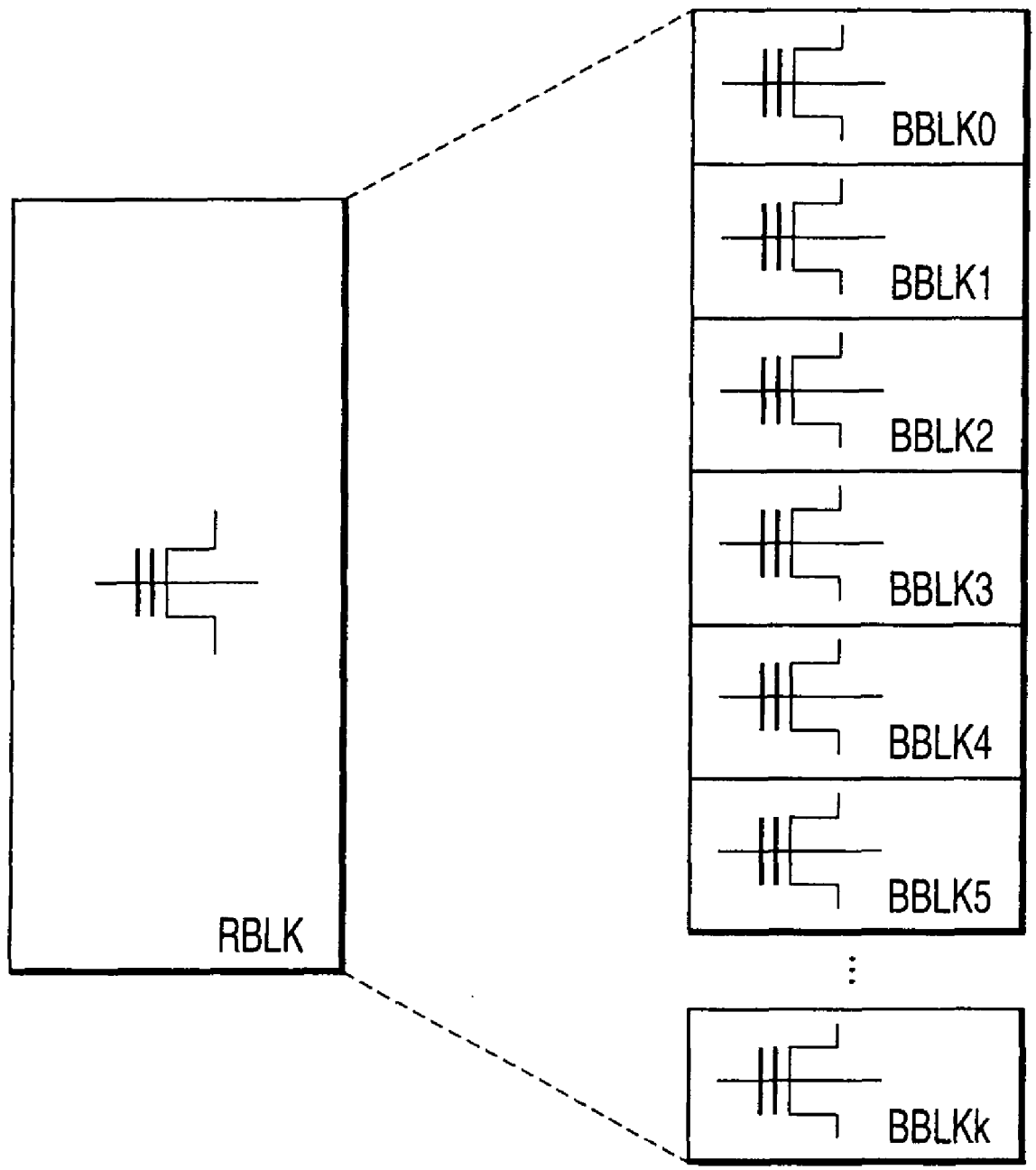
FIG. 17 is a block diagram of a memory cell array according to a modification of the fourth embodiment of the present invention.
Figure 18:
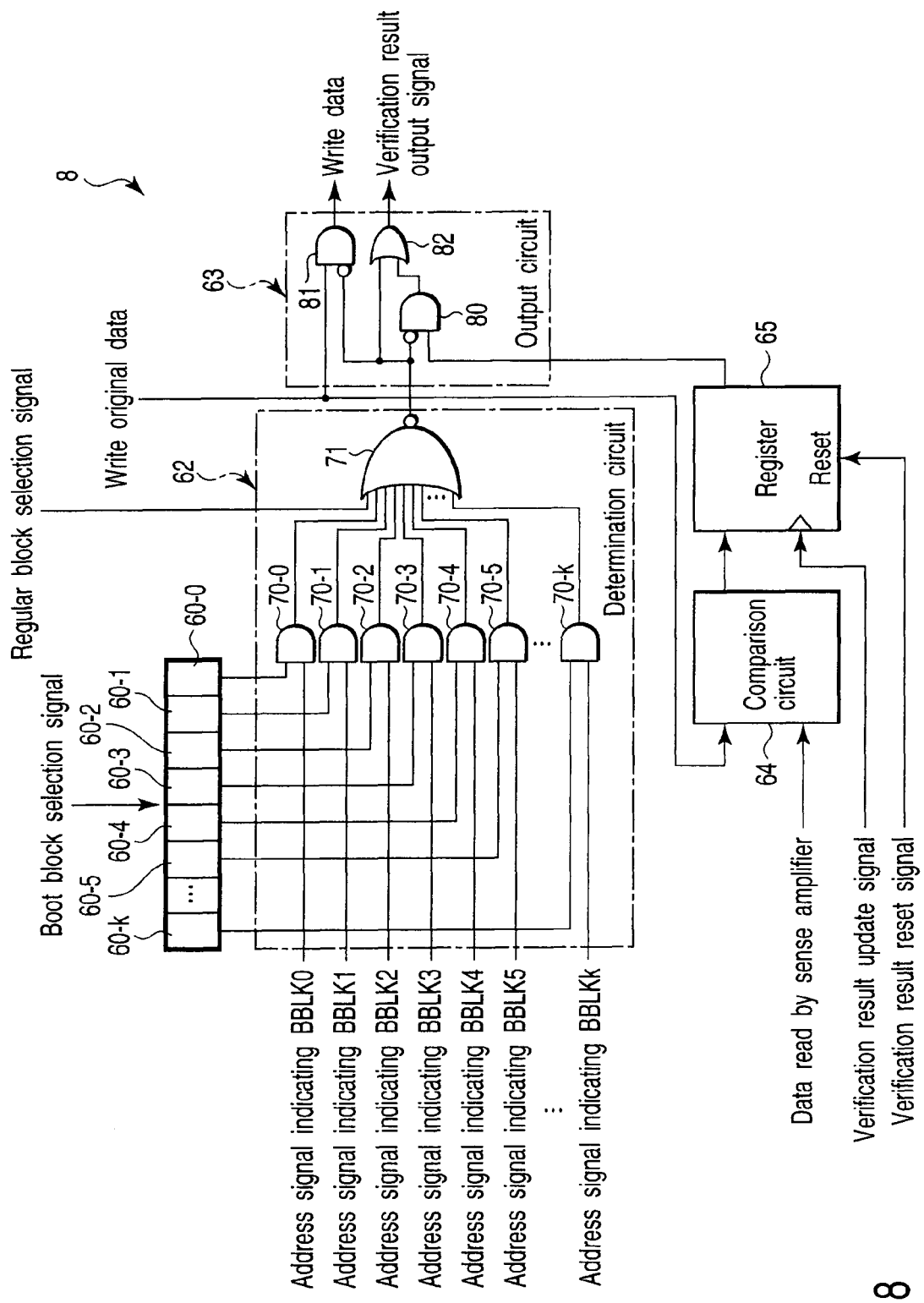
FIG. 18 is a circuit diagram of the verification circuit according to a modification of the fourth embodiment of the present invention.

Although a case where the size of the boot block BBLK is ¼ the size of the regular block RBLK has been described in this embodiment, the embodiment is not restricted to this size. FIG. 17 is a block diagram of the regular block RBLK and the boot block BBLK. The boot block BBLK may be obtained by dividing the regular block RBLK by (k+1) (k is a positive integer). FIG. 18 shows the configuration of the verification circuit 8 in this case. As shown in FIG. 18, selection information of the boot blocks BBLK0 to BBLKk is stored in the registers 60-0 to 60-k. The AND gates 70-0 to 70-k execute AND operation between a flag within the registers 60-0 to 60-k and an address signal indicating the boot blocks BBLK0 to BBLKk, respectively.

According to the semiconductor memory devices of the first to fourth embodiments of the present invention, the operating speed can be improved effectively by constructing part of the flash memory for controlling the microcomputer 2 into hardware. In the meantime, although the above embodiments have been described about the NOR type flash memory as an example, they can be applied to, for example, NAND type flash memory. Although in the above embodiments, a case where the power source circuit 11 and the sense amplifier 7 are controlled by the control circuit 12 has been described, other circuit blocks may be controlled by the control circuit 12. Its control content is not limited to those described in the embodiments. Further, according to the embodiments, when the regular block is selected, the output of the NOR gate 71 is set to "0" by a regular block selection signal. However, when the regular block is selected, all the registers 60-1 to 60-3 may be forced to be "1" while all signals indicating BBLK0 to BBLK3 may be forced to be set to "1" instead of using the regular block selection signal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device in which an operation is automatically carried out under a control of a processor, comprising:
   a first memory block including a plurality of nonvolatile memory cells, data held in the memory cells included in the first memory block being erased at a time;
   a plurality of second memory blocks including the memory cells, data held in the memory cells included in the second memory blocks being erase at a time, the number of the memory cells included in each of the second memory blocks being smaller than that in the first memory block;
   a sense amplifier which reads data from the memory cell and amplifies the data, the sense amplifier reading data from selected one of the second memory block and non-selected one of the second memory blocks continuously, when the data is read from one of the second memory block;
   a verification circuit which verifies whether or not write or erase of data to the memory cell has been carried out properly using the data read by the sense amplifier, the verification circuit, when the data is read from the non-selected one of the second memory cell block, determining that the write or erase of data has been performed properly regardless of the read data; and
   the processor which provides information concerning selection/non-selection of the second memory block to the verification circuit.

2. The device according to claim 1, wherein the information concerning selection/non-selection given from the processor is information indicating which of the second memory blocks has been selected, and
   the verification circuit includes
   a register configured to hold the information concerning selection/non-selection;
   a determination circuit which determines whether or not the memory cells from which data is read by the sense amplifier is included in the selected one of the second memory blocks by using an address of the verified memory cells and the information held in the register;
   a holding circuit which holds a result of verification about the data read by the sense amplifier; and
   an output circuit which, when it is determined that the memory cells is included in the selected one of the second memory blocks by the determination circuit, outputs the verification result held in the holding circuit and when it is determined that the memory cell is not included in the selected one of the second memory cells, outputs data indicating that the verification has been completed properly regardless of the verification result held in the holding circuit.

3. The device according to claim 1, wherein the memory size of each of the second memory blocks is equal, and
   the memory size of the first memory block is integer times the memory size of each of the second memory blocks.

4. The device according to claim 1, wherein the memory cells have a stacked gate including a charge accumulation layer and a control gate.

* * * * *